(12) United States Patent
Tanikawa et al.

(10) Patent No.: US 8,519,429 B2
(45) Date of Patent: Aug. 27, 2013

(54) ENCAPSULANT FOR OPTICAL SEMICONDUCTOR DEVICE AND OPTICAL SEMICONDUCTOR DEVICE USING SAME

(75) Inventors: Mitsuru Tanikawa, Osaka (JP); Takashi Watanabe, Osaka (JP); Shintaro Moriguchi, Kouka (JP); Osamu Inui, Osaka (JP); Yoshitaka Kunihiro, Osaka (JP); Ryosuke Yamazaki, Osaka (JP); Ayuko Oki, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 13 days.

(21) Appl. No.: 13/390,768

(22) PCT Filed: Jun. 22, 2011

(86) PCT No.: PCT/JP2011/064263
§ 371 (c)(1),
(2), (4) Date: Feb. 16, 2012

(87) PCT Pub. No.: WO2011/062294
PCT Pub. Date: Dec. 29, 2011

(65) Prior Publication Data
US 2012/0146088 A1    Jun. 14, 2012

(30) Foreign Application Priority Data

Jun. 24, 2010 (JP) .................................. 2010-143719

(51) Int. Cl.
*H01L 33/56* (2010.01)

(52) U.S. Cl.
USPC .......................................... 257/100; 257/475

(58) Field of Classification Search
USPC .................... 257/100, 475, E33.059
See application file for complete search history.

(56) References Cited

U.S. PATENT DOCUMENTS

| 2005/0003110 A1* | 1/2005 | Tanaka et al. ................ 428/1.23 |
| 2008/0033120 A1* | 2/2008 | Yoshitake et al. ............. 525/474 |

(Continued)

FOREIGN PATENT DOCUMENTS

| JP | 2001-199989 A | 7/2001 |
| JP | 2003-73452 A | 3/2003 |

(Continued)

OTHER PUBLICATIONS

International Preliminary Report on Patentability for Application No. PCT/JP2011/064263 mailed Jan. 24, 2013.

(Continued)

*Primary Examiner* — Thao P. Le
(74) *Attorney, Agent, or Firm* — Cheng Law Group, PLLC

(57) ABSTRACT

The present invention provides a sealant for an optical semiconductor device which is less likely to reduce its luminance and is also less likely to change its color even used in an energized state in harsh environments of high temperature and high humidity.
The sealant for an optical semiconductor device includes: a first organopolysiloxane not containing a hydrogen atom bound to a silicon atom, but containing an alkenyl group bound to a silicon atom and an aryl group bound to a silicon atom, a second organopolysiloxane containing a hydrogen atom bound to a silicon atom and an aryl group bound to a silicon atom, and a platinum-alkenyl complex. The platinum-alkenyl complex is a reaction product obtained by reacting chloroplatinic acid hexahydrate with not less than 6 equivalent of a bi- or more-functional alkenyl compound. The ratio of the number of the alkenyl group bound to a silicon atom in the organopolysiloxane to the number of the hydrogen atom bound to a silicon atom in the organopolysiloxane in the sealant is not less than 1.0 and not more than 2.5.

16 Claims, 1 Drawing Sheet

(56) References Cited

U.S. PATENT DOCUMENTS

| | | | |
|---|---|---|---|
| 2008/0262158 A1* | 10/2008 | Morita et al. | 525/100 |
| 2011/0227235 A1* | 9/2011 | Yoshitake et al. | 257/791 |
| 2011/0254047 A1* | 10/2011 | Yoshitake et al. | 257/100 |
| 2012/0153342 A1* | 6/2012 | Nishimura et al. | 257/99 |

FOREIGN PATENT DOCUMENTS

| | | |
|---|---|---|
| JP | 2008-222828 A | 9/2008 |
| JP | 2009-62446 A | 3/2009 |
| JP | 2010-13503 A | 1/2010 |
| JP | 2010-43136 A | 2/2010 |
| JP | 2010-84118 A | 4/2010 |
| JP | 2010-180323 A | 8/2010 |
| WO | WO-2010/027105 A1 | 3/2010 |

OTHER PUBLICATIONS

International Search Report for the Application No. PCT/JP2011/064263 mailed Oct. 18, 2011.

* cited by examiner

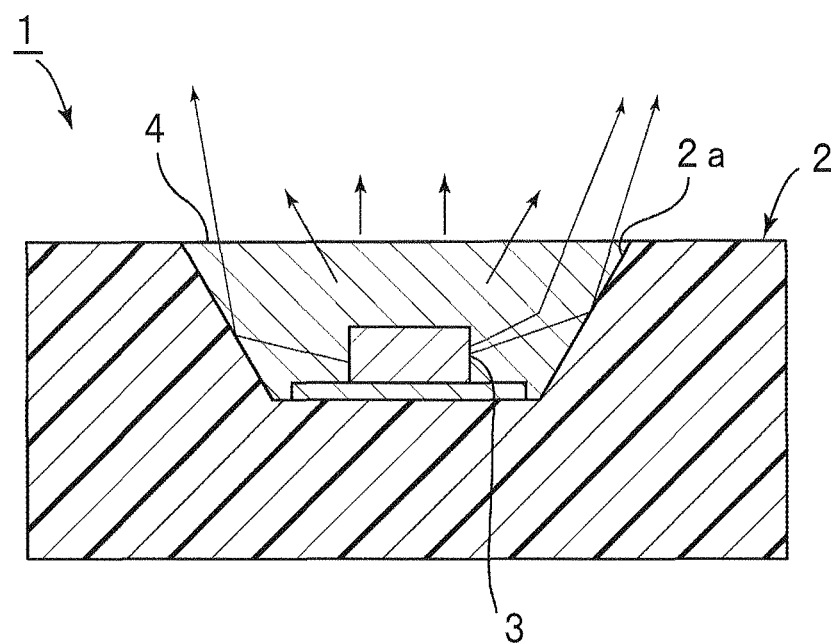

ENCAPSULANT FOR OPTICAL SEMICONDUCTOR DEVICE AND OPTICAL SEMICONDUCTOR DEVICE USING SAME

TECHNICAL FIELD

The present invention relates to a sealant for an optical semiconductor device that is used for sealing an optical semiconductor element in an optical semiconductor device. The present invention also relates to an optical semiconductor device in which the sealant for an optical semiconductor device is used.

BACKGROUND ART

Optical semiconductor devices such as light-emitting diode (LED) devices consume low power and have a long life. Moreover optical semiconductor devices can be used under harsh environments. For these reasons, optical semiconductor devices are used in a wide range of applications such as mobile phone backlight, liquid-crystal TV backlight, automobile lamps, lighting apparatuses, and signs.

When optical semiconductor elements (e.g. LED), which are light-emitting elements used in optical semiconductor devices are directly exposed to the atmosphere, the light-emitting performance of the optical semiconductor elements rapidly decreases due to moisture, floating dust, or the like in the atmosphere. To avoid this, such optical semiconductor elements are normally sealed with a sealant for an optical semiconductor device.

Patent Document 1 described below discloses an epoxy resin material including hydrogenated bisphenol A glycidyl ether, an alicyclic epoxy monomer, and a potential catalyst as a sealant for an optical semiconductor device. The epoxy resin material is cured by thermal cationic polymerization.
Patent Document 1: JP 2003-73452 A

SUMMARY OF THE INVENTION

Problems to be Solved by the Invention

If an optical semiconductor device including a conventional sealant for an optical device, such as one disclosed in Patent Document 1, is used in an energized state in harsh environments of high temperature and high humidity, problematically the luminance (brightness) gradually decreases.

Moreover, when a conventional sealant for an optical device is used in an energized state in harsh environments of high temperature and high humidity, the color of the sealant itself problematically changes.

The present invention aims to provide a sealant for use in an optical semiconductor device, which is less likely to reduce the luminance even used in an energized state in harsh environments of high temperature and high humidity, and is also less likely to change its color even used in an energized state in harsh environments of high temperature and high humidity. The present invention further aims to provide an optical semiconductor device in which the sealant for an optical semiconductor device is used.

Means for Solving the Problems

A broad aspect of the present invention provides a sealant for use in an optical semiconductor device, including a first organopolysiloxane not containing a hydrogen atom bound to a silicon atom, but containing an alkenyl group bound to a silicon atom and an aryl group bound to a silicon atom, a second organopolysiloxane containing a hydrogen atom bound to a silicon atom and an aryl group bound to a silicon atom, and a platinum-alkenyl complex. The platinum-alkenyl complex is obtainable by reacting chloroplatinic acid hexahydrate with not less than 6 equivalent of a bi- or higher-functional alkenyl compound, and the ratio (the number of the alkenyl group bound to a silicon atom/the number of the hydrogen atom bound to a silicon atom) of the number of the alkenyl group bound to a silicon atom in the organopolysiloxane to the number of the hydrogen atom bound to a silicon atom in the organopolysiloxane in the sealant is not less than 1.0 and not more than 2.5.

In a specific aspect of the sealant for an optical semiconductor device according to the present invention, the first organopolysiloxane is a first organopolysiloxane represented by formula (1A) or formula (1B) shown below,
the second organopolysiloxane is a second organopolysiloxane represented by formula (51A) or formula (51B) shown below,
an aryl group content in the first organopolysiloxane calculated based on formula (X1) shown below is from 30 mol % to 70 mol %, and
an aryl group content in the second organopolysiloxane calculated based on formula (X51) shown below is from 30 mol % to 70 mol %.

[Chem. 1]

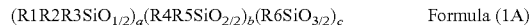

$(R1R2R3SiO_{1/2})_a(R4R5SiO_{2/2})_b(R6SiO_{3/2})_c$   Formula (1A)

In the formula (1A), a, b, and c satisfy the following equations: a/(a+b+c)=0 to 0.50, b/(a+b+c)=0.40 to 1.0, and c/(a+b+c)=0 to 0.50; and
at least one of R1 to R6 represents a phenyl group, at least one of R1 to R6 represents an alkenyl group, and the rest of the R1 to R6 other than phenyl groups and alkenyl groups represent $C_1$ to $C_8$ hydrocarbon groups.

[Chem. 2]

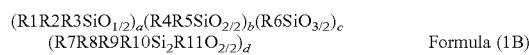

$(R1R2R3SiO_{1/2})_a(R4R5SiO_{2/2})_b(R6SiO_{3/2})_c$
$(R7R8R9R10Si_2R11O_{2/2})_d$   Formula (1B)

In the formula (1B), a, b, c and d satisfy the following equations: a/(a+b+c+d)=0 to 0.40, b/(a+b+c+d)=0.40 to 0.99, c/(a+b+c+d)=0 to 0.50, and d/(a+b+c+d)=0.01 to 0.40; and
at least one of R1 to R6 represents a phenyl group, at least one of R1 to R6 represents an alkenyl group, and the rest of the R1 to R6 other than phenyl groups and alkenyl groups represents $C_1$ to $C_8$ hydrocarbon groups, R7 to R10 each represent a $C_1$ to $C_8$ hydrocarbon group, and R11 represents a $C_1$ to $C_8$ bivalent hydrocarbon group.

[Chem. 3]

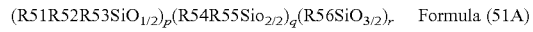

$(R51R52R53SiO_{1/2})_p(R54R55SiO_{2/2})_q(R56SiO_{3/2})_r$   Formula (51A)

In the formula (51A), p, q, and r satisfy the following equations: p/(p+q+r)=0.05 to 0.50, q/(p+q+r)=0.05 to 0.50, and r/(p+q+r)=0.20 to 0.80; and
at least one of R51 to R56 represents a phenyl group, at least one of R51 to R56 represents a hydrogen atom directly bound to a silicon atom, and the rest of the R51 to R56 other than phenyl groups and hydrogen atoms directly bound to a silicon atom represent $C_1$ to $C_8$ hydrocarbon groups.

[Chem. 4]

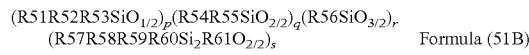

$(R51R52R53SiO_{1/2})_p(R54R55SiO_{2/2})_q(R56SiO_{3/2})_r$
$(R57R58R59R60Si_2R61O_{2/2})_s$   Formula (51B)

In the formula (51B), p, q, r and s satisfy the following equations: $p/(p+q+r+s)=0.05$ to 0.50, $q/(p+q+r+s)=0.05$ to 0.50, $r/(p+q+r+s)=0.20$ to 0.80, and $s/(p+q+r+s)=0.01$ to 0.40; and at least one of R51 to R56 represents a phenyl group, at least one of R51 to R56 represents a hydrogen atom directly bound to a silicon atom, and the rest of the R51 to R56 other than phenyl groups and hydrogen atoms directly bound to a silicon atom represent $C_1$ to $C_8$ hydrocarbon groups, R57 to R60 each represent a $C_1$ to $C_8$ hydrocarbon group, and R61 represents a $C_1$ to $C_8$ bivalent hydrocarbon group.

[Aryl group content(mol %)]=[(Average number of aryl group included in one molecule of the first organopolysiloxane whose average composition is represented by the formula (1A) or the formula (1B)×Molecular weight of the aryl group)/(Number average molecular weight of the first organopolysiloxane whose average composition is represented by the formula (1A) or the formula (1B))]×100    (Formula X1)

[Aryl group content(mol %)]=[(Average number of aryl group included in one molecule of the second organopolysiloxane whose average composition is represented by the formula (51A) or the formula (51B)×Molecular weight of the aryl group)/(Number average molecular weight of the second organopolysiloxane whose average composition is represented by the formula (51A) or the formula (51B))]×100    (Formula X51)

In another specific aspect of the sealant for an optical semiconductor device according to the present invention, the sealant includes at least one of the first organopolysiloxane represented by the formula (1B) and the second organopolysiloxane represented by the formula (51B).

In yet another specific aspect of the sealant for an optical semiconductor device according to the present invention, the platinum content derived from the platinum-alkenyl complex in the sealant is not less than 1 ppm and not more than 300 ppm.

In other specific aspect of the sealant for an optical semiconductor device according to the present invention, the second organopolysiloxane contains a unit represented by formula (51-a) shown below.

[Chem. 5]

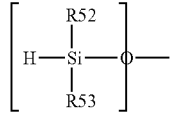

Formula (51-a)

In the formula (51-a), R52 and R53 each represent a hydrogen atom, a phenyl group, or a $C_1$ to $C_8$ hydrocarbon group.

In yet another specific aspect of the sealant for an optical semiconductor device according to the present invention, the proportion of the unit represented by the formula (51-a) in 100 mol % of the total siloxane unit of the second silicone resin is not less than 5 mol %.

In another specific aspect of the sealant for an optical semiconductor device according to the present invention, the first organopolysiloxane contains a diphenyl siloxane unit including one silicon atom and two phenyl groups bound to the silicon atom.

In yet another specific aspect of the sealant for an optical semiconductor device according to the present invention, the proportion of the diphenyl siloxane unit including one silicon atom and two phenyl groups bound to the silicon atom in 100 mol % of the total siloxane unit of the first organopolysiloxane is not less than 30 mol %.

In another specific aspect of the sealant for an optical semiconductor device according to the present invention, the second organopolysiloxane contains a diphenyl siloxane unit including one silicon atom and two phenyl groups bound to the silicon atom.

The optical semiconductor device according to the present invention includes an optical semiconductor element, and the sealant for an optical semiconductor device which is constructed according to the present invention, which is provided to seal the optical semiconductor element.

Effect of the Invention

The sealant for an optical semiconductor device according to the present invention includes a first organopolysiloxane not containing a hydrogen atom bound to a silicon atom, but containing an alkenyl group bound to a silicon atom and an aryl group bound to a silicon atom, a second organopolysiloxane containing a hydrogen atom bound to a silicon atom and an aryl group bound to a silicon atom, and a platinum-alkenyl complex which is obtainable by reacting chloroplatinic acid hexahydrate with not less than 6 equivalent of a bi- or higher-functional alkenyl compound. Furthermore, the ratio (the number of the alkenyl group bound to a silicon atom/the number of the hydrogen atom bound to a silicon atom) of the number of the alkenyl group bound to a silicon atom in the organopolysiloxane to the number of the hydrogen atom bound to a silicon atom in the organopolysiloxane in the sealant is not less than 1.0 and not more than 2.5. Therefore, if the optical semiconductor device using the sealant is used in an energized state in harsh environments of high temperature and high humidity, the luminance is less likely to decrease. Moreover, if used in an energized state in harsh environments of high temperature and high humidity, the color of the sealant for an optical semiconductor device is less likely to change.

BRIEF DESCRIPTION OF DRAWINGS

FIG. 1 is a front cross-sectional view showing an optical semiconductor device according to one embodiment of the present invention.

MODES FOR CARRYING OUT THE INVENTION

The following description will discuss details of the present invention.

The sealant for an optical semiconductor device according to the present invention includes a first organopolysiloxane, a second organopolysiloxane, and a platinum-alkenyl complex. The platinum-alkenyl complex is a reaction product obtainable by reacting chloroplatinic acid hexahydrate with not less than 6 equivalent of a bi- or higher-functional alkenyl compound.

The first organopolysiloxane does not contain a hydrogen atom bound to a silicon atom, but contains an alkenyl group bound to a silicon atom and an aryl group bound to a silicon atom. The second organopolysiloxane contains a hydrogen atom bound to a silicon atom and an aryl group bound to a silicon atom. The ratio (the number of the alkenyl group bound to a silicon atom/the number of the hydrogen atom bound to a silicon atom) of the number of the alkenyl group bound to a silicon atom in the organopolysiloxane to the number of the hydrogen atom bound to a silicon atom in the organopolysiloxane in the sealant is not less than 1.0 and not more than 2.5. In the case where the second organopolysiloxane contains an alkenyl group, in the above ratio, the number of the alkenyl group bound to a silicon atom includes the number of the alkenyl group in the second organopolysiloxane.

In the case where the sealant has the aforementioned composition, the semiconductor device using the sealant is less likely to reduce the luminance of light emitted therefrom even if the semiconductor device is used in harsh environments of repeated heating and cooling. Furthermore, the sealant itself is less likely to change its color even if it is used in harsh environments.

In terms of further suppressing reduction of the luminance of light emitted from the optical semiconductor device, and also further preventing color change of the sealant when used in harsh environments, the above ratio (the number of the alkenyl group bound to a silicon atom/the number of the hydrogen atom bound to a silicon atom) is preferably not less than 1.1 and preferably not more than 1.8.

If a conventional sealant for an optical semiconductor device is used in harsh environments where it is repeatedly heated and cooled, the sealant may crack or peel from the housing material and the like. Moreover, a conventional sealant for an optical semiconductor device may have a silver-plated electrode provided at a rear side of a light-emitting element to reflect light arriving at the rear side of the light-emitting element. If the sealant cracks or peels from the housing material, the silver-plated electrode is exposed to the atmosphere. If this happens, the silver plating may tarnish due to corrosion gases in the atmospheres such as hydrogen sulfide gas or sulfur dioxide gas. A tarnished electrode reduces the reflectance, problematically leading to reduction in the luminance of light emitted from the light-emitting element.

In terms of achieving a sealant which has an excellent gas barrier property, and hardly cracks or peels to avoid the aforementioned problems, the first organopolysiloxane is preferably a first organopolysiloxane represented by the formula (1A) or the formula (1B). In terms of achieving a sealant which has an good gas barrier property, and hardly cracks or peels, the first organopolysiloxane is preferably a first organopolysiloxane represented by the formula (51A) or the formula (51B).

In terms of achieving a sealant which has an excellent gas barrier property, and is far less likely to crack or peel, the sealant preferably includes at least one of the first organopolysiloxane represented by the formula (1B) and the second organopolysiloxane represented by the formula (51B).

The aryl group content in each of the first organopolysiloxane and the second organopolysiloxane calculated based on formula (X) shown below is preferably not less than 30 mol %, more preferably not less than 35 mol %, and preferably not more than 70 mol %, more preferably 65 mol % or less. The aryl group content of not less than the aforementioned minimum value and not more than the aforementioned maximum value further enhances the gas barrier property, and further prevents the sealant from peeling off.

[Aryl group content(mol %)]=[(Average number of aryl group included in one molecule of the first organopolysiloxane or the second organopolysiloxane×Molecular weight of the aryl group)/ (Number average molecular weight of the first organopolysiloxane or the second organopolysiloxane)]×100   (Formula X)

(First Organopolysiloxane)

The first organopolysiloxane contained in the sealant for an optical semiconductor device according to the present invention does not include a hydrogen atom bound to a silicon atom, but includes an alkenyl group bound to a silicon atom and an aryl group bound. An organopolysiloxane including a hydrogen atom bound to a silicon atom is excluded from the first organopolysiloxane. Since the first organopolysiloxane does not include a hydrogen atom bound to a silicon atom, the first organopolysiloxane is different from the second organopolysiloxane. The alkenyl group and the aryl group each are directly bound to a silicon atom. Examples of the aryl group include unsubstituted phenyl groups, substituted phenyl groups, unsubstituted phenylene groups, and substituted phenylene groups. A carbon atom in the carbon-carbon double bond of the alkenyl group may be bound to a silicon atom, or a carbon atom other than the carbon atom in the carbon-carbon double bond of the alkenyl group may be bound to a silicon atom.

In terms of achieving a sealant with further enhanced gas barrier property, the first organopolysiloxane is preferably a first organopolysiloxane represented by formula (1A) or formula (1B) shown below. It is noted that, a first organopolysiloxane other than the first organopolysiloxane represented by the formula (1A) or the formula (1B) shown below may also be used as the first organopolysiloxane. The first organopolysiloxane represented by the formula (1B) shown below may contain a phenylene group or may not contain a phenylene group. The first organopolysiloxane may be used solely, or two or more kinds thereof may be used in combination.

[Chem. 6]

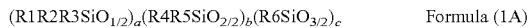

$(R1R2R3SiO_{1/2})_a(R4R5SiO_{2/2})_b(R6SiO_{3/2})_c$   Formula (1A)

In the formula (1A), a, b, and c satisfy the following equations: $a/(a+b+c)=0$ to $0.50$, $b/(a+b+c)=0.40$ to $1.0$, and $c/(a+b+c)=0$ to $0.50$; and at least one of R1 to R6 represents a phenyl group, at least one of R1 to R6 represents an alkenyl group, and the rest of the R1 to R6 other than phenyl groups and alkenyl groups represent $C_1$ to $C_8$ hydrocarbon groups. In the formula (1A), a unit represented by $(R4R5SiO_{2/2})$ and a unit represented by $(R6SiO_{3/2})$ each may include an alkoxy group or may include a hydroxy group.

[Chem. 7]

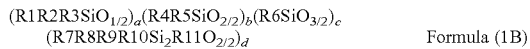

$(R1R2R3SiO_{1/2})_a(R4R5SiO_{2/2})_b(R6SiO_{3/2})_c$
$(R7R8R9R10Si_2R11O_{2/2})_d$   Formula (1B)

In the formula (1B), a, b, c and d satisfy the following equations: $a/(a+b+c+d)=0$ to $0.40$, $b/(a+b+c+d)=0.40$ to $0.99$, $c/(a+b+c+d)=0$ to $0.50$, and $d/(a+b+c+d)=0.01$ to $0.40$; and at least one of R1 to R6 represents a phenyl group, at least one of R1 to R6 represents an alkenyl group, and the rest of the R1 to R6 other than phenyl groups and alkenyl groups represents $C_1$ to $C_8$ hydrocarbon groups, R7 to R10 each represent a $C_1$ to $C_8$ hydrocarbon group, and R11 represents a $C_1$ to $C_8$ bivalent hydrocarbon group. In the formula (1B), a unit represented by $(R4R5SiO_{2/2})$, a unit represented by $(R6SiO_{3/2})$, and a unit represented by $(R7R8R9R10Si_2R11O_{2/2})$ each may include an alkoxy group or may include a hydroxy group.

The formula (1A) and the formula (1B) each are an average composition formula. Hydrocarbon groups in the formula (1A) and the formula (1B) may be linear or branched chains. R1 to R6 in the formula (1A) and the formula (1B) may be the same or different from one another. R7 to R10 in the formula (B) may be the same or different from one another. R7 to R10 in the formula (1B) may be the same or different from one another.

The oxygen atom part in the unit represented by $(R4R5SiO_{2/2})$, the oxygen atom part in the unit represented by (R6SiO$_{3/2}$), and the oxygen atom part in the unit represented by (R7R8R9R10Si$_2$R11O$_{2/2}$) in the formula (1A) and the formula (1B) each are an oxygen atom part forming a siloxane bond, an oxygen atom part in the alkoxy group, or an oxygen atom part in the hydroxy group.

Generally, in the respective units of the formula (1A) and the formula (1B), an alkoxy group content is small, and also a hydroxy group content is small as well. This is because, when an organic silicon compound such as an alkoxy silane compound is hydrolyzed and polymerized to provide the first organopolysiloxane, most of the alkoxy groups and the hydroxy groups are normally converted to form a partial structure of a siloxane bond. Namely, the oxygen atom in the alkoxy group and the oxygen atom in the hydroxy group are mostly converted to the oxygen atoms forming the siloxane bond. Presence of an alkoxy group or a hydroxy group in each of the units of the formula (1A) and the formula (1B) indicates that unreacted alkoxy group or hydroxy group not converted to the partial structure of the siloxane bond remains in a small amount. The same is true to the case where respective units of below-mentioned formula (51A) and formula (51B) include an alkoxy group and a hydroxy group.

Examples of the alkenyl group in the formula (1A) and the formula (1B) include a vinyl group, an allyl group, a butenyl group, a pentenyl group, and a hexenyl group. In terms of further enhancing the gas barrier property, the alkenyl group in the first organopolysiloxane and the alkenyl group in the formula (1A) and the formula (1B) is preferably a vinyl group or an allyl group, and more preferably a vinyl group.

The C$_1$ to C$_8$ hydrocarbon group in the formula (1A) and the formula (1B) is not particularly limited, and examples thereof include a methyl group, an ethyl group, an n-propyl group, an n-butyl group, an n-pentyl group, an n-hexyl group, an n-heptyl group, an n-octyl group, an isopropyl group, an isobutyl group, a sec-butyl group, a t-butyl group, an isopentyl group, a neopentyl group, a t-pentyl group, an isohexyl group, and a cyclohexyl group. The C$_1$ to O$_8$ bivalent hydrocarbon group in the formula (1B) is not particularly limited, and examples thereof include a methylene group, an ethylene group, a propylene group, a butylene group, a pentylene group, a hexylene group, a cyclohexylene group, and a phenylene group.

The aryl group content in the first organopolysiloxane represented by the formula (1A) or the formula (1B) calculated by formula (X1) shown below is preferably not less than 30 mol %, and is preferably not more than 70 mol %. The aryl group content of not less than 30 mol % further enhances the gas barrier property. The aryl group content of not more than 70 mol % tends to prevent the sealant from peeling off. In terms of far more enhancing the gas barrier property, the aryl group content is more preferably not less than 35 mol %. In terms of further preventing peeling of the sealant, the aryl group content is more preferably not more than 65 mol %.

[Aryl group content(mol %)]=[(Average number of aryl group included in one molecule of the first organopolysiloxane whose average composition is represented by the formula (1A) or the formula (1B)×Molecular weight of the aryl group)/(Number average molecular weight of the first organopolysiloxane whose average composition is represented by the formula (1A) or the formula (1B))]×100      (Formula X1)

In the case of using the first organopolysiloxane represented by the formula (1A), the aryl group in the formula (X1) represents a phenyl group. The aryl group content shows the phenyl group content.

In the case of using the first organopolysiloxane represented by the formula (1B), the aryl group in the formula (X1) represents a phenyl group and a phenylene group. The aryl group content shows a total content of the phenyl group and the phenylene group.

In the case where the first organopolysiloxane represented by the formula (1B) does not include a phenylene group, the total content of the phenyl group and the phenylene group means the phenyl group content.

The first s organopolysiloxane preferably includes a diphenyl siloxane unit containing one silicon atom and two phenyl groups bound to the silicon atom. Proportion of the diphenyl siloxane unit containing one silicon atom and two phenyl groups bound to the silicon atom in 100 mol % of the total siloxane unit of the first organopolysiloxane is preferably not less than 5 mol %, more preferably not less than 10 mol %, further preferably not less than 25 mol %, and especially preferably not less than 30 mol %. A larger proportion of the diphenyl siloxane unit and the proportion of the diphenyl siloxane unit with not less than 30 mol % of the proportion results in better dispensability of the sealant and, furthermore, in higher luminance of light extracted from a plurality of optical semiconductor devices. The proportion of the diphenyl siloxane unit is most preferably not less than 40 mol % and not more than 60 mol %. The proportion of the diphenyl siloxane unit of not more than the aforementioned upper limit results in better dispensability of the sealant and higher luminance of the light extracted from the semiconductor devices.

The diphenyl siloxane unit is preferably a unit represented by formula (1-b1) shown below. In the unit represented by the formula (1-b1), generally, an oxygen atom at the terminal position and an adjacent silicon atom form a siloxane bond, and the oxygen atom is shared with the adjacent unit. Therefore, one of the terminal oxygen atoms is expressed as "O$_{1/2}$."

[Chem. 8]

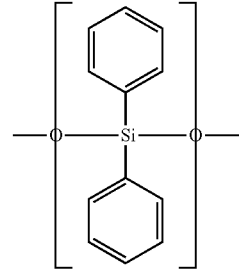

Formula (1-b1)

In the formulae (1A) and (1B), each unit represented by (R4R5SiO$_{2/2}$) preferably includes the unit represented by the formula (1-b1). The unit represented by (R4R5SiO$_{2/2}$) may include only the unit represented by formula (1-b1) or may include the unit represented by the formula (1-b1) and units other than the unit represented by the formula (1-b1).

In terms of further enhancing the gas barrier property, the unit (R7R8R9R10Si$_2$R11O$_{2/2}$) in the formula (1B) is preferably a unit represented by formula (1b-1) shown below. The unit represented by the formula (1b-1) includes a phenylene group, and the phenylene group is a substituted or unsubstituted phenylene group. The term "phenylene group" used herein also includes a substituted phenylene group in which the C$_1$ to C$_8$ hydrocarbon group is replaced by a benzene ring. In the unit represented by the formula (1b-1) shown below, generally an oxygen atom at the terminal position and an adjacent silicon atom form a siloxane bond, and the oxygen atom is shared with the adjacent unit. Therefore, one of the terminal oxygen atoms is expressed as "O$_{1/2}$."

[Chem. 9]

Formula (1b-1)

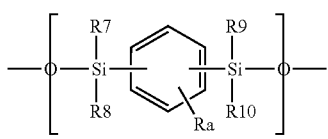

In the formula (1b-1), Ra represents a hydrogen atom or a $C_1$ to $C_8$ hydrocarbon group, and R7 to R10 each represent a $C_1$ to $O_8$ hydrocarbon group. The hydrocarbon group may be a linear or branched chain. Binding sites of the three groups to the benzene ring in the formula (1b-1) are not particularly limited.

The unit $(R7R8R9R10Si_2R11O_{2/2})$ in the formula (1B) is preferably a unit represented by formula (1b-2) shown below. The unit represented by the formula (1b-2) includes a phenylene group, and the phenylene group is a substituted or unsubstituted phenylene group. A binding site of the Ra to the benzene ring in the formula (1b-2) is not particularly limited.

[Chem. 10]

Formula (1b-2)

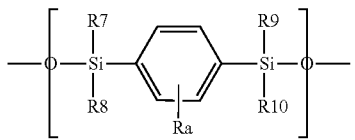

In the formula (1b-2), Ra represents a hydrogen atom or a $C_1$ to $C_8$ hydrocarbon group, and R7 to R10 each represent a $C_1$ to $C_8$ hydrocarbon group.

The unit $(R7R8R9R10Si_2R11O_{2/2})$ in the formula (1B) is more preferably a unit represented by formula (1b-3) shown below. The unit represented by the formula (1b-3) includes a phenylene group, and the phenylene group is an unsubstituted phenylene group.

[Chem. 11]

Formula (1b-3)

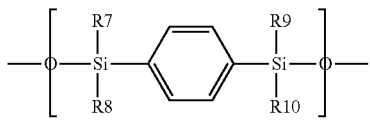

In the formula (1b-3), R7 to R10 each represent a $C_1$ to $C_8$ hydrocarbon group.

In the first organopolysiloxane represented by the formula (1A) or the formula (1B), the unit represented by $(R4R5SiO_{2/2})$ (hereinafter, also referred to as a bi-functional unit) may include a unit represented by formula (1-2) shown below, i.e., a structure in which one of oxygen atoms bound to a silicon atom in the bi-functional unit constitutes a hydroxy group or an alkoxy group.

$(R4R5SiXO_{1/2})$  (Formula 1-2)

The unit represented by $(R4R5SiO_{2/2})$ may include a moiety surrounded by dashed lines of a unit represented by formula (1-b) shown below, and may also include a moiety surrounded by dashed lines of a unit represented by formula (1-2-b) shown below. Namely, a unit including groups represented by R4 and R5, and an alkoxy group or a hydroxy group remaining at a terminal position is also included in the unit represented by $(R4R5SiO_{2/2})$. Specifically, in the case where the alkoxy group has been converted into a partial skeleton of the siloxane bond, the unit represented by $(R4R5SiO_{2/2})$ corresponds to the moiety surrounded by dashed lines of a unit represented by the formula (1-b) shown below. In the case where an unreacted alkoxy group remains, or where the alkoxy group has been converted into a hydroxy group, the unit represented by $(R4R5SiO_{2/2})$ including the remaining alkoxy group or hydroxy group corresponds to the moiety surrounded by dashed lines of a unit represented by the formula (1-2-b) shown below.

[Chem. 12]

Formula (1-b)

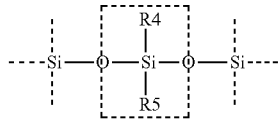

Formula (1-2-b)

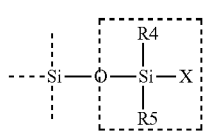

In the formulae (1-2) and (1-2-b), X represents OH or OR, and the OR represents a linear or branched $C_1$ to $O_4$ alkoxy group. R4 and R5 in the formulae (1-b), (1-2), and (1-2-b) are respectively the same groups as the R4 and R5 in the formula (1A) or (1B).

In the first organopolysiloxane represented by the formula (1A) or the formula (1B), a unit represented by $(R6SiO_{3/2})$ (hereinafter, also referred to as trifunctional unit) may include a structure represented by formula (1-3) or (1-4) shown below; namely a structure in which the two oxygen atoms bound to a silicon atom in the trifunctional unit each constitute a hydroxy group or an alkoxy group, or a structure in which one of the two oxygen atoms bound to a silicon atom in the trifunctional unit constitutes a hydroxy group or an alkoxy group.

$(R6SiX_2O_{1/2})$  Formula (1-3)

$(R6SiXO_{2/2})$  Formula (1-4)

The unit represented by $(R6SiO_{3/2})$ includes a moiety surrounded by dashed lines of a unit represented by formula (1-c) shown below, and may further include a moiety surrounded by dashed lines of a unit represented by formula (1-3-c) or (1-4-c) shown below. Namely, a unit including a group represented by R6 and further including an alkoxy group or a hydroxy group remaining at a terminal position is also included in the unit represented by $(R6SiO_{3/2})$.

[Chem. 13]

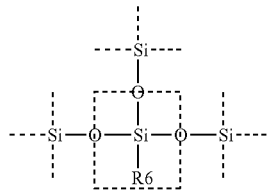
Formula (1-c)

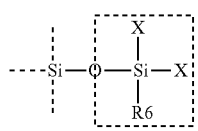
Formula (1-3-c)

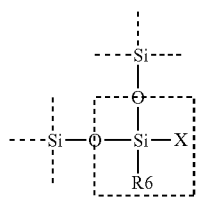
Formula (1-4-c)

In the formulae (1-3), (1-3-c), (1-4), and (1-4-c), X represents OH or OR, and the OR represents a linear or branched C1 to C4 alkoxy group. R6 in the formulae (1-c), (1-3), (1-3-c), (1-4), and (1-4-c) is the same group as the R6 in the formula (1A) or the formula (1B).

In the first organopolysiloxane represented by the formula (1B), the unit represented by $(R7R8R9R10Si_2R11O_{2/2})$ may include a structure represented by formula (1-5) shown below; namely a structure in which one of oxygen atoms bound to a silicon atom in the unit $(R7R8R9R10Si_2R11O_{2/2})$ constitutes an hydroxy group or an alkoxy group.

$(R7R8R9R10Si_2R11XO_{1/2})$   Formula (1-5)

The unit represented by $(R7R8R9R10Si_2R11O_{2/2})$ includes a moiety surrounded by dashed lines of a unit represented by formula (1-d) shown below, and may further include a moiety surrounded by dashed lines of a unit represented by formula (1-5-d) shown below. Namely, a unit including groups represented by R7, R8, R9, R10, and R11, and further including an alkoxy group or a hydroxy group remaining at a terminal position is also included in the unit represented by $(R7R8R9R10Si_2R11O_{2/2})$.

[Chem. 14]

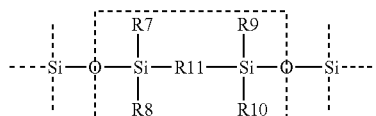
Formula (1-d)

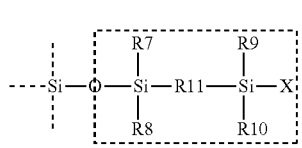
Formula (1-5-d)

In the formulae (1-5) and (1-5-d), X represents OH or OR, and the OR represents a linear or branched C1 to C4 alkoxy group. R7 to R11 in the formulae (1-d), (1-5), and (1-5-d) are the same groups as the R7 to R11 in the formula (1B).

The linear or branched $C_1$ to $C_4$ alkoxy group in the formulae (1-b) to (1-d), (1-2) to (1-5), (1-2-b), (1-3-c), (1-4-c), and (1-5-d) is not particularly limited, and examples thereof include a methoxy group, an ethoxy group, an n-propoxy group, an n-butoxy group, an isopropoxy group, an isobutoxy group, a sec-butoxy group, and a t-butoxy group.

In the formula (1A), a value of a/(a+b+c) is 0 at minimum and 0.50 at maximum. In the case where a/(a+b+c) satisfies the maximum value, the sealant can have further enhanced heat resistance, and can be prevented from peeling off. In the formula (1A), a preferable maximum value of a/(a+b+c) is 0.45, and more preferably 0.40. In the case where a is 0, and a value of a/(a+b+c) is 0, the unit of $(R1R2R3SiO_{1/2})$ does not exist in the formula (1A).

In the formula (1A), a value of b/(a+b+c) is 0.40 at minimum and 1.0 at maximum. In the case where b/(a+b+c) satisfies the minimum value, a cured product of the sealant is not too hard, and thus cracking hardly occurs in the sealant.

In the case where b/(a+b+c) satisfies the maximum value, the sealant has further enhanced gas barrier property. In the formula (1A), a preferable minimum value of b/(a+b+c) is 0.50.

In the formula (1A), a value of c/(a+b+c) is 0 at minimum and 0.50 at maximum. In the case where c/(a+b+c) satisfies the minimum value, the sealant has high heat resistance, and thus thickness of a cured product of the sealant under high temperature conditions is less likely to decrease. In the case where c/(a+b+c) satisfies the maximum value, the sealant can easily maintain a proper viscosity as sealant, and can have further enhanced adhesion property. In the formula (1A), a preferable maximum value of c/(a+b+c) is 0.45, more preferably 0.40, and still more preferably 0.35. In the case where c is 0, and a value of c/(a+b+c) is 0, the unit of $(R6SiO_{3/2})$ does not exist in the formula (1A).

In the formula (1B), a value of a/(a+b+c+d) is 0 at minimum and 0.40 at maximum. In the case where a/(a+b+c+d) satisfies the maximum value, the sealant can have further enhanced heat resistance, and can be prevented from peeling off. In the case where a is 0, and a value of a/(a+b+c+d) is 0, the unit of $(R1R2R3SiO_{1/2})$ does not exist in the formula (1B).

In the formula (1B), a value of b/(a+b+c+d) is 0.40 at minimum and 0.99 at maximum. In the case where b/(a+b+c+d) satisfies the minimum value, a cured product of the sealant is not too hard, and thus cracking hardly occurs in the sealant. In the case where b/(a+b+c+d) satisfies the maximum value, the sealant has further enhanced gas barrier property.

In the formula (1B), a value of c/(a+b+c+d) is 0 at minimum and 0.50 at maximum. In the case where c/(a+b+c+d) satisfies the maximum value, the sealant can easily maintain a proper viscosity as sealant, and can have further enhanced adhesion property. In the case where c is 0, and a value of c/(a+b+c+d) is 0, the unit of $(R6SiO_{3/2})$ does not exist in the formula (1B).

In the formula (1B), the value of d/(a+b+c+d) is 0.01 at minimum and is 0.40 at maximum. In the case where d/(a+b+c+d) satisfies the minimum value and the maximum value, a sealant which has high gas barrier property against corrosion gases, and is less likely to crack or peel off even used in harsh environments can be provided. In terms of achieving a sealant for an optical semiconductor device which has a higher gas barrier property against corrosion gases, and is far less likely to crack or peel off even used in harsh environments, in the formula (1B), a value of d/(a+b+c+d) is preferably 0.03 and more preferably 0.05 at minimum, and is preferably 0.35 and more preferably 0.30 at maximum.

The $^{29}$Si-nuclear magnetic resonance analysis (hereinafter, also referred to as NMR) of the first organopolysiloxane using tetramethylsilane (hereinafter, also referred to as TMS) as standard shows that peaks corresponding to the unit represented by $(R1R2R3SiO_{1/2})_a$ appear in a range of about +10 to −5 ppm in the formula (1A) and the formula (1B); peaks corresponding to the respective bi-functional units represented by $(R4R5SiO_{2/2})_b$ in the formula (1A) and the formula (1B), and (1-2) appear in a range of about −10 to −50 ppm; peaks corresponding to the respective trifunctional units represented by $(R6SiO_{3/2})_c$ in the formula (1A) and the formula (1B), and (1-3) and (1-4) appear in a range of about −50 to −80 ppm; and peaks corresponding to the respective units represented by $(R7R8R9R10Si_2R11O_{2/2})$ in the formula (1B), and (1-5) appear in a range of about 0 to −5 ppm.

By the $^{29}$Si—NMR analysis and comparison of the peak areas of respective signals, the ratios of the respective units in the formula (1A) and the formula (1B) can be determined.

If the $^{29}$Si—NMR analysis using TMS as standard does not identify the units in the formula (1A) and the formula (1B), results of $^1$H-NMR analysis are optionally used in addition to the result of the $^{29}$Si—NMR analysis so that the ratios of the respective units in the formula (1A) and the formula (1B) can be determined.

(Second Organopolysiloxane)

A second organopolysiloxane contained in the sealant for an optical semiconductor device according to the present invention contains a hydrogen atom bound to a silicon atom, and an aryl group bound to a silicon atom. The hydrogen atom and the silicon atom each are directly bound to the silicon atom. Examples of the aryl group include unsubstituted phenyl groups, substituted phenyl groups, unsubstituted phenylene groups, and substituted phenylene groups.

In terms of achieving a sealant having far more enhanced gas barrier property, the second organopolysiloxane is preferably a second organopolysiloxane represented by formula (51A) or formula (51B) shown below. It is noted that, a second organopolysiloxane other than the second organopolysiloxane represented by the formula (51A) or the formula (51B) shown below may be used as the second organopolysiloxane. The organopolysiloxane represented by the formula (51B) shown below may contain a phenylene group or may not contain a phenylene group. The second organopolysiloxane may be used solely, or two or more kinds thereof may be used in combination.

[Chem. 15]

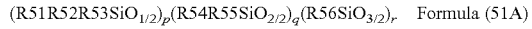

Formula (51A)

In the formula (51A), p, q, and r satisfy the following equations: p/(p+q+r)=0.05 to 0.50; q/(p+q+r)=0.05 to 0.50; and r/(p+q+r)=0.20 to 0.80, and at least one of R51 to R56 represents a phenyl group, at least one of R51 to R56 represents a hydrogen atom directly bound to a silicon atom, and the rest of the R51 to R56 other than phenyl groups and hydrogen atoms directly bound to a silicon atom represent $C_1$ to $C_8$ hydrocarbon groups. In the formula (51A), a unit represented by $(R54R55SiO_{2/2})$ and a unit represented by $(R56SiO_{3/2})$ each may contain an alkoxy group or a hydroxy group.

[Chem. 16]

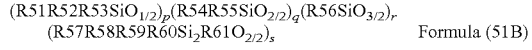

Formula (51B)

In the formula (51B), p, q, r and s satisfy the following equations: p/(p+q+r+s)=0.05 to 0.50; q/(p+q+r+s)=0.05 to 0.50; r/(p+q+r+s)=0.20 to 0.80; and s/(p+q+r+s)=0.01 to 0.40, and at least one of R51 to R56 represents a phenyl group, at least one of R51 to R56 represents a hydrogen atom directly bound to a silicon atom, and the rest of the R51 to R56 other than phenyl groups and hydrogen atoms directly bound to a silicon atom represent $O_1$ to $C_8$ hydrocarbon groups, R57 to R60 each represent a $C_1$ to $C_8$ hydrocarbon group, and R61 represents a $C_1$ to $C_8$ bivalent hydrocarbon group. In the formula (51B), a unit represented by $(R54R55SiO_{2/2})$, a unit represented by $(R56SiO_{3/2})$, and a unit represented by $(R57R58R59R60Si_2R61O_{2/2})$ may each contain an alkoxy group or may contain a hydroxy group.

The formula (51A) and the formula (51B) each are an average composition formula. Hydrocarbon groups in the formula (51A) and the formula (51B) may be linear or branched chains. R51 to R56 in the formula (51A) and the formula (51B) may be the same or different from one another. R57 to R60 in the formula (51B) may be the same or different from one another.

The oxygen atom part in the unit represented by $(R54R55SiO_{2/2})$ in the formula (51A) and the formula (51B), the oxygen atom part in the unit represented by $(R56SiO_{3/2})$, and the oxygen atom part in the unit represented by $(R57R58R59R60Si_2R61O_2)$ each are an oxygen atom part forming a siloxane bond, an oxygen atom part in the alkoxy group, or an oxygen atom part in the hydroxy group.

The $C_1$ to $O_8$ hydrocarbon group in the formula (51A) and the formula (51B) is not particularly limited, and examples thereof include a methyl group, an ethyl group, an n-propyl group, an n-butyl group, an n-pentyl group, an n-hexyl group, an n-heptyl group, an n-octyl group, an isopropyl group, an isobutyl group, a sec-butyl group, a t-butyl group, an isopentyl group, a neopentyl group, a t-pentyl group, an isohexyl group, a cyclohexyl group, a vinyl group, and an allyl group.

The $C_1$ to $C_8$ bivalent hydrocarbon group in the formula (51B) is not particularly limited, and examples thereof include a methylene group, an ethylene group, a propylene group, a butylene group, a pentylene group, a hexylene group, a cyclohexylene group, and a phenylene group.

The aryl group content in the second organopolysiloxane represented by the formula (51A) or the formula (51B) calculated by formula (X51) shown below is preferably not less than 30 mol % and is preferably not more than 70 mol %. The aryl group content of not less than 30 mol % further enhances the gas barrier property. The aryl group content of not more than 70 mol % tends not to cause peeling of the sealant.

In terms of achieving more enhanced gas barrier property, the aryl group content is more preferably not less than 35 mol %. In terms of further preventing peeling of the sealant, the aryl group content is more preferably not more than 65 mol %.

[Aryl group content(mol %)]=[(Average number of aryl group included in one molecule of the second organopolysiloxane whose average composition is represented by the formula (51A) or the formula (51B)×Molecular weight of the aryl group)/(Number average molecular weight of the second organopolysiloxane whose average composition is represented by the formula (51A) or the formula (51B))]×100    (Formula X51)

In the case of using the organopolysiloxane represented by the formula (51A), the aryl group in the formula (X51) is a phenyl group, and the aryl group content is the phenyl group content.

In the case of using the organopolysiloxane represented by the formula (51B), the aryl group in the formula (X51) is a phenyl group and a phenylene group. The aryl group content means a total content of the phenyl group and the phenylene group.

In the case where the second organopolysiloxane represented by the formula (51B) does not include a phenylene group, the total content of the phenyl group and the phenylene group means the phenyl group content.

In terms of enhancing the curability of the sealant, and further preventing cracking and peeling of the sealant in the heat cycles, the second organopolysiloxane preferably includes a unit represented by formula (51-a) shown below. In the unit represented by the formula (51-a), generally, an oxygen atom at the terminal position and an adjacent silicon atom form a siloxane bond, and the oxygen atom is shared with the adjacent unit. Therefore, one of the terminal oxygen atoms is expressed as "$O_{1/2}$."

[Chem. 17]

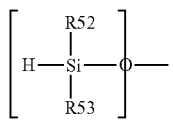

Formula (51-a)

In the formula (51-a), R52 and R53 each represent a hydrogen atom, a phenyl group, or a $C_1$ to $C_8$ hydrocarbon group. The R52 and R53 each preferably represent a phenyl group, or a $C_1$ to $C_8$ hydrocarbon group.

In terms of enhancing the curability of the sealant, and further preventing cracking and peeling of the sealant in the heat cycles, preferably the unit represented by (R51R52R53SiO$_{1/2}$) in the formula (51A) and the formula (51B) includes a unit in which R51 represents a hydrogen atom bound to a silicon atom, and R52 and R53 each preferably represent a phenyl group or a $C_1$ to $C_8$ hydrocarbon group.

Namely, the unit represented by (R51R52R53SiO$_{1/2}$) in the formula (51A) and the formula (51B) preferably includes the unit represented by the formula (51-a). The unit represented by (R51R52R53SiO$_{1/2}$) may include only the unit represented by formula (51-a) or may include the unit represented by the formula (51-a) and units other than the unit represented by the formula (51-a).

In terms of enhancing the curability of the sealant, and further preventing cracking and peeling of the sealant in the heat cycles, the proportion of the unit represented by the formula (51-a) in 100 mol % of the total siloxane unit of the second organopolysiloxane is preferably not less than 5 mol % and more preferably not less than 10 mol %, and preferably not more than 50 mol % and more preferably not more than 45 mol %.

The proportion of the unit in which R51 represents a hydrogen atom bound to a silicon atom, and R52 and R53 each represent a hydrogen atom, a phenyl group, or a $C_1$ to $C_8$ hydrocarbon group (i.e., the unit represented by the formula (51-a)), in 100 mol % of the total unit in the formula (51A) and the formula (51B) is preferably not less than 5 mol % and more preferably not less than 10 mol %, and preferably not more than 50 mol % and more preferably not more than 45 mol %.

The second organopolysiloxane preferably includes a diphenyl siloxane unit containing one silicon atom and two phenyl groups bound to the silicon atom. Proportion of the diphenyl siloxane unit containing one silicone atom and two phenyl groups bound to the silicone atom in 100 mol % of the total siloxane unit of the second organopolysiloxane is preferably not less than 5 mol %, more preferably not less than 10 mol %, and further preferably not less than 20 mol %. A larger proportion of the diphenyl siloxane unit and the proportion of the diphenyl siloxane unit with at least 20 mol % of the proportion results in better dispensability of the sealant and, furthermore, higher luminance of light extracted from a plurality of optical semiconductor devices. The proportion of the diphenyl siloxane unit is preferably not more than 60 mol %. The proportion of the diphenyl siloxane unit of not more than the upper limit results in better dispensability of the sealant and higher luminance of the light extracted from the semiconductor devices.

The diphenyl siloxane unit is preferably a unit represented by formula (51-b1) shown below. In the unit represented by the formula (51-b1), generally, an oxygen atom at the terminal position and an adjacent silicon atom form a siloxane bond, and the oxygen atom is shared with the adjacent unit. Therefore, one of the terminal oxygen atoms is expressed as "$O_{1/2}$."

[Chem. 18]

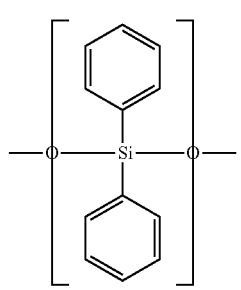

Formula (51-b1)

In the formula (51A) and the formula (51B), the unit represented by (R4R5SiO$_{2/2}$) preferably includes a unit represented by the formula (51-b1). The unit represented by (R4R5SiO$_{2/2}$) may only include the unit represented by the formula (51-b1) or may include the unit represented by the formula (51-b1) and units other than the unit represented by the formula (51-b1).

In terms of further enhancing the gas barrier property, the unit (R57R58R59R60Si$_2$R61O$_{2/2}$) in the formula (51B) is preferably a unit represented by formula (51b-1) shown below. The unit represented by the formula (51b-1) includes a phenylene group, and the phenylene group is a substituted or unsubstituted phenylene group.

[Chem. 19]

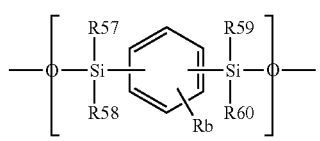

Formula (51b-1)

In the formula (51b-1), Rb represents a hydrogen atom or a $C_1$ to $C_8$ hydrocarbon group, and R57 to R60 each represent a $C_1$ to $C_8$ hydrocarbon group. The hydrocarbon group may be a linear or branched chain. A binding site of each of the three groups to the benzene ring in the formula (51b-1) is not particularly limited.

The unit (R57R58R59R60Si$_2$R61O$_{2/2}$) in the formula (51B) is preferably a unit represented by formula (51b-2) shown below. The unit represented by the formula (51b-2)

includes a phenylene group, and the phenylene group is a substituted or unsubstituted phenylene group. A binding site of the Rb to the benzene ring in the formula (51b-2) is not particularly limited.

[Chem. 20]

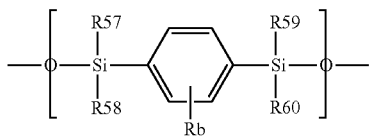

Formula (51b-2)

In the formula (51b-2), Rb represents a hydrogen atom or a $C_1$ to $C_8$ hydrocarbon group, and R57 to R60 each represent a $C_1$ to $C_8$ hydrocarbon group.

The unit $(R57R58R59R60Si_2R61O_{2/2})$ in the formula (51B) is more preferably a unit represented by formula (51b-3) shown below. The unit represented by the formula (51b-3) includes a phenylene group, and the phenylene group is an unsubstituted phenylene group.

[Chem. 21]

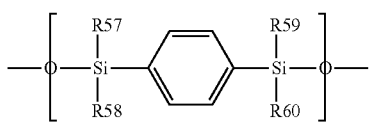

Formula (51b-3)

In the formula (51b-3), R57 to R60 each represent a $C_1$ to $C_8$ hydrocarbon group.

In the second organopolysiloxane represented by the unit $(R54R55SiO_{2/2})$ (hereinafter, also referred to as a bi-functional unit) in the formula (51A) or (51B) may include a structure represented by formula (51-2) shown below, namely a structure in which one of oxygen atoms bound to a silicon atom constitutes an hydroxy group or an alkoxy group.

$(R54R55SiXO_{1/2})$  Formula (51-2)

The unit represented by $(R54R55SiO_{2/2})$ may include a moiety surrounded by dashed lines of a unit represented by formula (51-b) shown below, and may further include a moiety surrounded by dashed lines of a unit represented by formula (51-2-b) shown below. Namely, a unit including groups represented by R54 and R55, and further including an alkoxy group or a hydroxy group remaining at a terminal position may also be included in the unit represented by $(R54R55SiO_{2/2})$.

[Chem. 22]

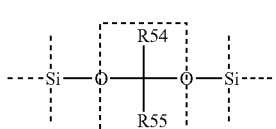

Formula (51-b)

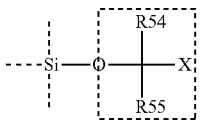

Formula (51-2-b)

In the formulae (51-2) and (51-2-b), X represents OH or OR, and the OR represents a linear or branched $C_1$ to $C_4$ alkoxy group. R54 and R55 in the formulae (51-b), (51-2), and (51-2-b) are respectively the same groups as the R54 and R55 in the formula (51A) or (51B).

In the second organopolysiloxane represented by the formula (51A) or (51B), a unit represented by $(R56SiO_{3/2})$ (hereinafter, also referred to as trifunctional unit) may include a structure represented by formula (51-3) or (51-4) shown below, namely a structure in which the two oxygen atoms bound to a silicon atom in the trifunctional unit constitute a hydroxy group or an alkoxy group, or a structure in which one of the two oxygen atoms bound to a silicon atom in the trifunctional unit constitutes a hydroxy group or an alkoxy group.

$(R56SiX_2O_{1/2})$  Formula (51-3)

$(R56SiXO_{2/2})$  Formula (51-4)

The unit represented by $(R56SiO_{3/2})$ includes a moiety surrounded by dashed lines of a unit represented by formula (51-c) shown below, and may further include a moiety surrounded by dashed lines of a unit represented by formula (51-3-c) or (51-4-c) shown below. Namely, a unit including a group represented by R56 and further including an alkoxy group or a hydroxy group remaining at a terminal position is also included in the unit represented by $(R56SiO_{3/2})$.

[Chem. 23]

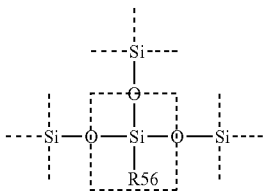

Formula (51-c)

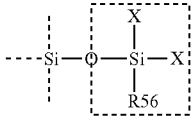

Formula (51-3-c)

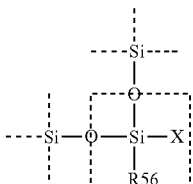

Formula (51-4-c)

In the formulae (51-3), (51-3-c), (51-4), and (51-4-c), X represents OH or OR, and the OR represents a linear or branched C1 to C4 alkoxy group. R56 in the formulae (51-c), (51-3), (51-3-c), (51-4), and (51-4-c) is the same group as the R56 in the formulae (51A) and (51B).

In the second organopolysiloxane represented by the formula (51B), the unit represented by (R57R58R59R60Si$_2$R61O$_{2/2}$) may include a structure represented by formula (51-5) shown below, namely a structure in which one of oxygen atoms bound to a silicon atom in the unit (R57R58R59R60Si$_2$R61O$_{2/2}$) constitutes an hydroxy group or an alkoxy group.

(R57R58R59R60Si$_2$XR61O$_{1/2}$)　　　Formula (51-5)

The unit represented by (R57R58R59R60Si$_2$R61O$_{2/2}$) includes a moiety surrounded by dashed lines of a unit represented by formula (51-d) shown below, and may further include a moiety surrounded by dashed lines of a unit represented by formula (51-5-d) shown below. Namely, a unit including groups represented by R57, R58, R59, R60, and R61, and further including an alkoxy group or a hydroxy group remaining at a terminal position is also included in the unit represented by (R57R58R59R60Si$_2$R61O$_{2/2}$).

[Chem. 24]

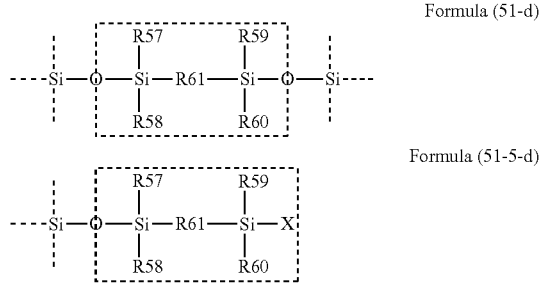

In the formulae (51-5) and (51-5-d), X represents OH or OR, and the OR represents a linear or branched C1 to C4 alkoxy group. R57 to R61 in the formulae (51-d), (51-5), and (51-5-d) are the same groups as the R57 to R61 in the formula (51B).

The linear or branched $C_1$ to $C_4$ alkoxy group in the formulae (51-b) to (51-d), (51-2) to (51-5), (51-2-b), (51-3-c), (51-4-c), and (51-5-d) is not particularly limited, and examples thereof include a methoxy group, an ethoxy group, an n-propoxy group, an n-butoxy group, an isopropoxy group, an isobutoxy group, a sec-butoxy group, and a t-butoxy group.

In the formula (51A), a value of p/(p+q+r) is 0.05 at minimum and 0.50 at maximum. In the case where p/(p+q+r) satisfies the maximum value, the sealant can have further enhanced heat resistance, and can be prevented from peeling off. In the formula (51A), a preferable minimum value of p/(p+q+r) is 0.10, and a preferable maximum value is 0.45.

In the formula (51A), a value of q/(p+q+r) is 0.05 at minimum and 0.5 at maximum. In the case where q/(p+q+r) satisfies the minimum value, a cured product of the sealant is not too hard, and thus cracking hardly occurs in the sealant. In the case where q/(p+q+r) satisfies the maximum value, the sealant has further enhanced gas barrier property. In the formula (51A), a preferable minimum value of q/(p+q+r) is 0.10, and a preferable maximum value is 0.45.

In the formula (51A), a value of r/(p+q+r) is 0.20 at minimum and 0.80 at maximum. In the case where r/(p+q+r) satisfies the minimum value, the sealant has higher hardness, becomes more resistant to scars and trash adhesion, and has further enhanced heat resistance. Also, thickness of a cured product of the sealant is less likely to decrease under high temperature conditions. In the case where r/(p+q+r) satisfies the maximum value, the sealant can easily maintain a proper viscosity as sealant, and can have further enhanced adhesion property.

In the formula (51B), a value of p/(p+q+r+s) is 0.05 at minimum and 0.50 at maximum. In the case where p/(p+q+r+s) satisfies the maximum value, the sealant can have further enhanced heat resistance, and can be prevented from peeling off.

In the formula (51B), a value of q/(p+q+r+s) is 0.05 at minimum and 0.50 at maximum. In the case where q/(p+q+r+s) satisfies the minimum value, a cured product of the sealant is not too hard, and thus cracking is less likely to occur in the sealant. In the case where q/(p+q+r+s) satisfies the maximum value, the sealant has further enhanced gas barrier property.

In the formula (51B), a value of r/(p+q+r+s) is 0.20 at minimum and 0.80 at maximum. In the case where r/(p+q+r+s) satisfies the maximum value, the sealant can maintain a proper viscosity as sealant, and can have further enhanced adhesion property.

In the formula (51B), a value of s/(p+q+r+s) is 0.01 at minimum and 0.40 at maximum. In the case where s/(p+q+r+s) satisfies the minimum value and the maximum value, a sealant for an optical semiconductor device can be obtained which has high gas barrier property against corrosive gas, and is less likely to crack or peel off even when used in harsh environments. In terms of obtaining a sealant for an optical semiconductor device which has higher gas barrier property, and is far less likely to crack or peel off even when used in harsh environments, a preferable minimum value of s/(p+q+r+s) in the formula (51B) is 0.03, more preferably 0.05, and a preferable maximum value of s/(p+q+r+s) is 0.35, more preferably 0.30.

The $^{29}$Si-nuclear magnetic resonance analysis (hereinafter, also referred to as NMR) of the second organopolysiloxane using tetramethylsilane (hereinafter, also referred to as TMS) as standard shows that peaks corresponding to the unit represented by (R51R52R53SiO$_{1/2}$)$_p$ in the formula (51A) and the formula (51B) appear in a range of about +10 to −5 ppm; peaks corresponding to the respective bi-functional units represented by (R54R55SiO$_{2/2}$)$_q$ in the formula (51A) and the formula (51B), and (51-2) appear in a range of about −10 to −50 ppm; peaks corresponding to the respective trifunctional units represented by (R56SiO$_{3/2}$)$_r$ in the formula (51A) and the formula (51B), and (51-3) and (51-4) appear in a range of about −50 to −80 ppm; and peaks corresponding to the respective units represented by (R57R58R59R60Si$_2$R61O$_{2/2}$) in the formula (51B), and (51-5) appear in a range of about 0 to −5 ppm.

By the $^{29}$Si—NMR analysis and comparison of the peak areas of respective signals, the ratios of the respective units in the formula (51A) and the formula (51B) can be determined.

If the $^{29}$Si—NMR analysis using TMS as standard does not identify the units in the formula (51A) and the formula (51B), results of $^1$H-NMR analysis are optionally used in addition to the result of the $^{29}$Si—NMR analysis so that the ratios of the respective units in the formula (51A) and the formula (51B) can be determined.

The amount of the second organopolysiloxane based on 100 parts by weight of the first organopolysiloxane is preferably not less than 10 parts by weight and preferably not more than 400 parts by weight. The amount of the first organopolysiloxane and the amount of the second organopolysiloxane within the above range can provide a sealant having an enhanced gas barrier property. In terms of obtaining a sealant having further enhanced gas barrier property, the minimum amount of the second organopolysiloxane based on 100 parts by weight of the first organopolysiloxane is more preferably 30 parts by weight and further preferably 50 parts by weight, and the maximum amount thereof is more preferably 300 parts by weight and further preferably 200 parts by weight.

(Other Behaviors and Production Methods of the First and Second Organopolysiloxane)

The minimum amount of the alkoxy group in the first and second organopolysiloxane is preferably 0.5 mol % and more preferably 1 mol %, and the maximum amount thereof is preferably 10 mol % and more preferably 5 mol %. The alkoxy content in the aforementioned preferable ranges can further enhance the adhesion property of the sealant.

The alkoxy content satisfying the preferable minimum amount further enhances the adhesion property of the sealant. The alkoxy content satisfying the preferable maximum amount increases the storage stability of the first and second organopolysiloxane and the sealant, and further enhances the heat resistance of the sealant.

The alkoxy group content refers to the amount of the alkoxy group contained in the average composition formula of the first and second organopolysiloxane.

The first and second organopolysiloxane each preferably do not contain a silanol group. If the first and second organopolysiloxane each do not contain a silanol group, the storage stability of the first and second organopolysiloxane and the sealant increase. The silanol group can be reduced by heating in vacuo. The silanol group content can be measured by infrared spectroscopy.

The minimum number average molecular weight (Mn) of the first and second organopolysiloxane is preferably 500, more preferably 800, and still more preferably 1000. The maximum number average molecular weight (Mn) of the first and second organopolysiloxane is preferably 50000, and more preferably 15000. The average number weight satisfying the preferable minimum levels reduces volatile components during thermal curing. Thus, the thickness of a cured product of the sealant is less likely decrease under temperature conditions. The average number weight satisfying the preferable maximum levels leads to easier viscosity control.

The number average molecular weight (Mn) is determined by gel permeation chromatography (GPC) using polystyrene as a standard. The number average molecular weight (Mn) means a value determined using a measuring apparatus produced by Waters (Column: two columns, Shodex GPC LF-804 (length: 300 mm), Temperature: 40° C., Flow rate: 1 mL/min, Solvent: tetrahydrofuran, Standard material: polystyrene).

Methods of synthesizing the first and second organopolysiloxane are not particularly limited, and a method including hydrolysis of an alkoxysilane compound and subsequent condensation reaction, and a method including hydrolysis of a chlorosilane compound and subsequent condensation reaction may be exemplified. In terms of better control of the reactions, a method including hydrolysis of an alkoxysilane compound and subsequent condensation reaction is preferable.

Examples of the method including hydrolysis of an alkoxysilane compound and subsequent condensation reaction include a method of reacting an alkoxysilane compound in the presence of water and an acidic or basic catalyst. A hydrolyzed product of a disiloxane compound may be used.

Examples of an organic silicon compound to introduce an aryl group such as a phenyl group into the first and second organopolysiloxane include triphenylmethoxysilane, triphenylethoxysilane, diphenyldimethoxysilane, diphenyldiethoxysilane, methyl(phenyl)dimethoxysilane, and phenyl trimethoxysilane.

Examples of an organic silicon compound to introduce the unit ($R_{57}R_{58}R_{59}R_{60}Si_2R_{61}O_{2/2}$) or the unit ($R_7R_8R_9R_{10}Si_2R_{11}O_{2/2}$) into the first and second organopolysiloxane include
1,4-bis(dimethylmethoxysilyl)benzene,
1,4-bis(diethylmethoxysilyl)benzene,
1,4-bis(ethoxyethylmethylsilyl)benzene,
1,6-bis(dimethylmethoxysilyl)hexane,
1,6-bis(diethylmethoxysilyl)hexane, and
1,6-bis(ethoxyethylmethylsilyl)hexane.

Examples of an organic silicon compound to introduce an alkenyl group into the first organopolysiloxane include vinyltrimethoxysilane, vinyltriethoxysilane, vinylmethyldimethoxysilane, methoxydimethylvinylsilane, and 1,3-divinyl-1,1,3,3-tetramethyldisiloxane.

Examples of an organic silicon compound to introduce a hydroxy atom directly bound to a silicon atom into the second organopolysiloxane include trimethoxysilane, triethoxysilane, methyldimethoxysilane, methyldiethoxysilane, and 1,1,3,3-tetramethyldisiloxane.

Examples of other organic silicon compounds which can be used to obtain the first and second organopolysiloxane include trimethylmethoxysilane, trimethylethoxysilane, dimethyldimethoxysilane, dimethyldiethoxysilane, isopropyl(methyl)dimethoxysilane, cyclohexyl(methyl)dimethoxysilane, methyltrimethoxysilane, methyltriethoxysilane, ethyltrimethoxysilane, ethyltriethoxysilane, hexyltrimethoxysilane, and octyltrimethoxysilane.

Examples of the acidic catalyst include inorganic acids, organic acids, acid anhydrides of inorganic acids and derivatives thereof, and acid anhydrides of organic acids and derivative thereof.

Examples of the inorganic acids include hydrochloric acid, phosphoric acid, boric acid and carbonic acid. Examples of the organic acids include formic acid, acetic acid, propionic acid, butyric acid, lactic acid, malic acid, tartaric acid, citric acid, oxalic acid, malonic acid, succinic acid, glutaric acid, adipionic acid, fumaric acid, maleic acid, and oleic acid.

Examples of the basic catalyst include alkali metal hydroxides, alkali metal alkoxides, and silanol compounds of alkali metal.

Examples of the alkali metal hydroxide include sodium hydroxide, potassium hydroxide, and cesium hydroxide. Examples of the alkali metal alkoxides include sodium-t-butoxide, potassium-t-butoxide, and cesium-t-butoxide.

Examples of the silanol compounds of the alkali metal include sodium silanolate compounds, potassium silanolate compounds, and cesium silanolate compounds. Potassium catalysts or cesium catalysts are preferable among the examples.

(Platinum-Alkenyl Complex)

The platinum-alkenyl complex contained in the sealant for an optical semiconductor device according to the present invention is a catalyst to cause hydrosilylation reaction between the alkenyl group bound to a silicon atom in the organopolysiloxane and the hydrogen atom bound to a silicon atom in the organopolysiloxane. The platinum-alkenyl complex is a platinum catalyst, and is a catalyst for hydrosilylation reaction.

The platinum-alkenyl complex is a reaction product of chloroplatinic acid hexahydrate and not less than 6 equivalent of a bi- or higher-functional alkenyl compound. The platinum-alkenyl complex is obtainable by reacting chloroplatinic acid hexahydrate with not less than 6 equivalent of a bi- of higher-functional alkenyl compound. The platinum-alkenyl complex may be used solely, or two or more kinds thereof may be used in combination.

Concomitant use of the aforementioned specific first and second organopolysiloxane and the specific platinum-alkenyl complex prevents the luminance of light emitted from the optical semiconductor device from decreasing, and also prevents color of the sealant from changing, even used in harsh environments. Moreover, use of the platinum-alkenyl complex can increase the transparency of the sealant.

The chloroplatinic acid hexahydrate ($H_2PtCl_6 \cdot 6H_2O$) is used as platinum material for preparing the platinum-alkenyl complex.

Examples of the not less than 6 equivalent of bi- or higher-functional alkenyl compound for preparing the platinum-alkenyl compound include 1,3-divinyl-1,1,3,3-tetramethyldisiloxane, 1,3-dimethyl-1,3-diphenyl-1,3-divinyldisiloxane, and 1,3,5,7-tetramethyl-1,3,5,7-tetravinylcyclotetrasiloxane.

With regard to the term "equivalent" in the not less than 6 equivalent of bi- or higher-functional alkenyl compound, one equivalent means a weight of one mole of the alkenyl compound corresponding to one mole of the chloroplatinic acid hexahydrate. The amount of the not less than 6 equivalent of bi- or higher-functional alkenyl compound is preferably not more than 50 equivalent amount.

Examples of the solvents to be used for preparing the platinum-alkenyl complex include alcohol solvents such as methanol, ethanol, 2-propanol, and 1-butanol. Aromatic solvents such as toluene and xylene may also be used. The solvent may be used solely, or two or more kinds thereof may be used in combination.

In addition to the foregoing ingredients, a monofunctional vinyl compound may be used to prepare the platinum-alkenyl complex. Examples of the monofunctional vinyl compound include trimethoxyvinylsilane, triethoxyvinylsilane, and vinylmethyldimethoxysilane.

With regard to the reaction product of chloroplatinic acid hexahydrate and not less than 6 equivalent of a bi- or higher-functional alkenyl compound, the platinum element is covalently bound to, is coordinated to, or is covalently coordinated to the not less than 6 equivalent of bi- or higher-functional alkenyl compound.

The platinum element content derived from the platinum-alkenyl complex in the sealant is preferably not less than 0.01 ppm and preferably not more than 1000 ppm. The platinum element content derived from the platinum-alkenyl complex in the sealant is more preferably not less than 1 ppm and more preferably not more than 300 ppm. The platinum element content of the above minimum value or higher, especially not less than 1 ppm, can easily cure the sealant sufficiently, can further prevent decrease in the luminance of light emitted from the optical semiconductor device including the sealant, and can further enhance the gas barrier property of the sealant. The platinum element content of the above maximum value or lower, especially not more than 300 ppm, can further prevent color of the sealant from changing.

(Silicon Oxide Particles)

Preferably, the sealant for an optical semiconductor device of the present invention further contains silicon oxide particles.

Use of the silicon oxide particles can control the viscosity of the sealant before curing in an appropriate range without deteriorating heat resistance and light resistance of a cured product of the sealant. Thus, the handleability of the sealant can be improved.

The minimum primary particle diameter of the silicon oxide particles is preferably 5 nm, more preferably 8 nm, and the maximum primary particle diameter thereof is preferably 200 nm, more preferably 150 nm. The primary particle diameter of the silicon oxide particles satisfying the preferable minimum value further enhances the dispersibility of the silicon oxide particles, and further increases the transparency of a cured product of the sealant. The primary particle diameter of the silicon oxide particles satisfying the preferable maximum value sufficiently achieves viscosity-increasing effect at a temperature of 25° C., and also prevents decrease in the viscosity while raising the temperature.

The primary particle diameter of the silicon oxide particles is determined as follows. A cured product of the sealant for an optical semiconductor device is observed using a transmission electron microscope (Trade name "JEM-2100") produced by JEOL Ltd.). The sizes of respective 100 pieces of the primary particles of the silicon oxide particles in a view site are measured, and an average of the measured values is determined as a primary particle diameter. If the silicon oxide particles have a spherical form, the primary particle diameter means an average of the diameters of the silicon oxide particles. If the silicon oxide particles have a non-spherical form, the primary particle diameter means an average of the longer diameters of the silicon oxide particles.

The BET surface area of the silicon oxide particles is preferably 30 $m^2/g$ at minimum, and is preferably 400 $m^2/g$ at maximum. The BET surface area of the silicon oxide particles of at least 30 $m^2/g$ can control the viscosity of the sealant at a temperature of 25° C. in an appropriate range, and can thus prevent decrease in the viscosity while raising the temperature. The BET surface area of the silicon oxide particles of 400 $m^2/g$ or less hardly causes agglomeration of the silicon oxide particles. As a result, the dispersibility of the silicon oxide particles can be enhanced, and the transparency of a cured product of the sealant can be further increased.

The silicon oxide particles are not particular limited, and examples thereof include; silica produced by dry method, such as fumed silica and fused silica; and silica produced by wet method, such as colloidal silica, sol-gel silica, and precipitated silica. In terms of obtaining the sealant containing little volatile components and has a higher transparency, fumed silica is preferably used as the silicon oxide particles.

Examples of the fumed silica include Aerosil 50 (surface area: δ 50 $m^2/g$), Aerosil 90 (surface area: 90 $m^2/g$), Aerosil 130 (surface area: 130 $m^2/g$), Aerosil 200 (surface area: 200 $m^2/g$), Aerosil 300 (surface area: 300 $m^2/g$), and Aerosil 380 (surface area: 380 $m^2/g$) (all produced by Nippon Aerosil Co., Ltd.).

Surface of the silicon oxide particles are preferably treated with an organic silicon compound. The surface treatment significantly increases dispersibility of the silicon oxide particles, and further prevents reduction of the viscosity of the sealant before curing due to temperature increase.

The organic silicon compound is not particularly limited, and examples thereof include a silane-based compound containing an alkyl group, a silicon-based compound containing a siloxane backbone such as dimethylsiloxane, a silicon-based compound containing an amino group, a silicon-based compound containing a (meth) acryloyl group, and a silicon-based compound containing an epoxy group. The (meth) acryloyl group means an acryloyl group and a methacryloyl group.

In terms of further increasing the dispersibility of the silicon oxide particles, the organic silicon compound used for the surface treatment is preferably at least one selected from the group consisting of an organic silicon compound containing a dimethyl silyl group, an organic silicon compound containing a trimethyl silyl group, and an organic silicon compound containing a polydimethyl siloxane group. In terms of still further increasing the dispersibility of the silicon oxide particles, the organic silicon compound used for the surface treatment is preferably at least one selected from the group consisting of an organic silicon compound containing a trimethyl silyl group and an organic silicon compound containing a polydimethyl siloxane group.

Examples of the method for the surface treatment with an organic silicon compound include, in the case of using an organic silicon compound containing a dimethyl silyl group or an organic silicon compound containing a trimethyl silyl group, a method of treating the surface of the silicon oxide particles with dichlorodimethylsilane, dimethyldimethoxysilane, hexamethyldisilazane, trimethylsilylchloride, trimethylmethoxysilane, or the like. In the case of using an organic silicon compound containing a polydimethyl siloxane group, a method of treating the surface of the silicon oxide particles with a compound containing a silanol group at a terminal end of the polydimethyl siloxane group, or the like is exemplified.

Examples of commercially available silicon oxide particles surface-treated with the organic silicon compound containing a dimethyl silyl group include R974 (surface area: 170 m$^2$/g), and R964 (surface area: 250 m$^2$/g) (all produced by Nippon Aerosil Co., Ltd.).

Examples of commercially available silicon oxide particles surface-treated with the organic silicon compound containing a trimethyl silyl group include RX200 (surface area: 140 m$^2$/g), and R8200 (surface area: 140 m$^2$/g) (all produced by Nippon Aerosil Co., Ltd.).

Examples of commercially available silicon oxide particles surface-treated with the organic silicon compound containing a polydimethyl siloxane group include RY200 (surface area: 120 m$^2$/g) (produced by Nippon Aerosil Co., Ltd.).

The method for treating the surface of the silicon oxide particles with the organic silicon compound is not particularly limited. Examples of the method include direct processing methods such as a dry method of adding the silicon oxide particles in a mixer and subsequently adding the organic silicon compound under stirring, a slurry method of adding the organic silicon compound in a slurry of the silicon oxide particles, and a spray method of spraying the organic silicon compound to the dried silicon oxide particles. Examples of the mixer used in the dry method include a Henschel mixer, and a V-shape mixer. In the dry method, the organic silicon compound is added directly, or as an alcohol solution, an organic solvent solution, or an aqueous solution.

In order to prepare the silicon oxide particles surface treated with the organic silicon compound, at the time of mixing the silicon oxide particles with a matrix resin such as the first and the second organopolysiloxane, the organic silicon compound may be directly added, i.e., an integral blending method or the like may be employed in preparation of the sealant for an optical semiconductor device.

The amount of the silicon oxide particles in total 100 parts by weight of the first organopolysiloxane and the second organopolysiloxane is preferably not less than 0.5 parts by weight and preferably not more than 40 parts by weight. A more preferable minimum amount of the silicon oxide particles in total 100 parts by weight of the first organopolysiloxane and the second organopolysiloxane is 1 part by weight, and a more preferable maximum amount thereof is 35 parts by weight. The amount of the silicon oxide particles satisfying the minimum value can prevent decrease in the viscosity upon curing. The amount of the silicon oxide particles satisfying the maximum value can control the viscosity of the sealant in a more appropriate range, and can also further enhance the transparency of the sealant.

(Phosphor)

The sealant for an optical semiconductor device according to the present invention may further include a phosphor. The phosphor functions to absorb light emitted from the light-emitting element sealed by the sealant for an optical semiconductor device and to generate fluorescence so that eventually light having desired color can be provided.

For example, in the case where an ultraviolet LED chip is used as light-emitting element to finally provide white light, preferably a blue phosphor, a red phosphor, and a green phosphor are used in combination. In the case where a blue LED chip is used as light-emitting element to finally provide white light, preferably a green phosphor and a red phosphor are used in combination, or preferably a yellow phosphor is used. The phosphor may be used solely or in combination of two or more kinds.

The blue phosphor is not particularly limited, and examples thereof include (Sr, Ca, Ba, Mg)$_{10}$(PO$_4$)$_6$Cl$_2$:Eu, (Ba, Sr)MgAl$_{10}$O$_{17}$:Eu, and (Sr, Ba)$_3$MgSi$_2$O$_8$:Eu.

The red phosphor is not particularly limited, and examples thereof include (Sr, Ca)S:Eu, (Ca, Sr)$_2$Si$_5$N$_8$:Eu, CaSiN$_2$:Eu, CaAlSiN$_3$:Eu, Y$_2$O$_2$S:Eu, La$_2$O$_2$S:Eu, LiW$_2$O$_8$: (Eu, Sm), (Sr, Ca, Bs, Mg)$_{10}$(PO$_4$)$_8$Cl$_2$:(Eu, Mn), and Ba$_3$MgSi$_2$O$_8$: (Eu, Mn).

The green phosphor is not particularly limited, and examples thereof include Y$_3$(Al, Ga)$_5$O$_{12}$:Ce, SrGa$_2$S$_4$:Eu, Ca$_3$Sc$_2$Si$_3$O$_{12}$:Ce, SrSiON:Eu, ZnS: (Cu, Al) BaMgAl$_{10}$O$_{17}$ (Eu, Mn) and SrAl$_2$O$_4$:E.

The yellow phosphor is not particularly limited, and examples thereof include Y$_3$Al$_5$O$_{12}$:Ce, (Y, Gd)$_3$Al$_5$O$_{12}$:Ce, Tb$_3$Al$_5$O$_{12}$:Ce, CaGa$_2$S$_4$:Eu, and Sr$_2$SiO$_4$:Eu.

Another example of the phosphor include a perylene-based compound, which is an organic phosphor.

(Coupling Agent)

The sealant for an optical semiconductor device according to the present invention may further include a coupling agent to provide adhesiveness.

The coupling agent is not particularly limited, and may be silane coupling agents or the like. Examples of the silane coupling agents include vinyltriethoxysilane, vinyltrimethoxysilane, 3-glycidoxypropyltrimethoxysilane, 2-(3,4-epoxycyclohexyl)ethyltrimethoxysilane, γ-methacryloxypropyltrimethoxysilane, γ-aminopropyltrimethoxysilane, and N-phenyl-3-aminopropyltrimethoxysilane. The coupling agent may be used alone or in combination of two or more kinds thereof.

(Other Components)

The sealant for an optical semiconductor device according to the present invention may further include additives, if needed, such as dispersants, antioxidants, defoaming agents, colorants, modifiers, denaturants, leveling agents, light diffusing agents, thermal conductive fillers, and flame retardants.

Solutions respectively containing one kind or two or more kinds of the first organopolysiloxane, the second organopolysiloxane, and the platinum-alkenyl complex may be separately prepared, and the sealant for an optical semiconductor device may be prepared by mixing a plurality of the solutions immediately before use. For example, the sealant for an optical semiconductor device according to the present invention may be prepared, for example, by separately preparing a solution A containing the first organopolysiloxane and the platinum-alkenyl complex and a solution B containing the second organopolysiloxane, and mixing the solution A and the solution B immediately before use. In this manner, by separately preparing the first solution containing the first organopolysiloxane and the platinum-alkenyl complex and the second solution B containing the second organopolysiloxane, the storage stability can be enhanced. The components other than the first organopolysiloxane, the second organopolysiloxane, and the platinum-alkenyl complex may be added to the first solution or may be added to the second solution.

(Details and Usage of Sealant for an Optical Semiconductor Device)

The curing temperature of the sealant for an optical semiconductor device according to the present invention is not particularly limited. The preferable lowest curing temperature of the sealant for an optical semiconductor device according to the present invention is 80° C., more preferably 100° C., and the preferable highest curing temperature is 180° C., more preferably 150° C. The curing temperature satisfying the preferable lowest temperature allows curing of the sealant to sufficiently proceed. The curing temperature satisfying the preferable highest temperature tends not to cause thermal degradation of the package.

The curing method is not particularly limited but is preferably a step-cure method. The step-cure method is a method including temporary curing at a low temperature and subsequent substantial curing at a high temperature. The step-cure method can prevent shrinkage on curing of the sealant.

The production method of the sealant for an optical semiconductor device according to the present invention is not particularly limited. Examples of the production method include a method in which the first organopolysiloxane, the second organopolysiloxane, the platinum-alkenyl complex, and optional other components are mixed by a mixer such as a homodisper, a homomixer, a versatile mixer, a planetarium mixer, a kneader, a three-roll mill, and a beads mill at normal temperature or under heating.

The light-emitting element is not particularly limited as long as the light-emitting element includes a semiconductor. For example, in the case where the light-emitting element is light-emitting diode, examples thereof include a structure in which a semiconductor material for LED style is layered on a substrate. Examples of the semiconductor material in this example include GaAs, GaP, GaAlAs, GaAsP, AlGaInP, GaN, InN, AlN, InGaAlN, and SIC.

Examples of the material for the substrate includes single crystals of sapphire, spinel, SiC, Si, ZnO, and GaN. A buffer layer may be formed between the substrate and the semiconductor material, if necessary. Examples of the material for the buffer layer include GaN and AlN.

Specific examples of the optical semiconductor device according to the present invention include a light-emitting diode device, a semiconductor laser device, and a photo coupler. The optical semiconductor device of this kind may favorably be used as backlight for a liquid crystal display or the like, lightings, various sensors, light source for printers, photocopiers or the like, light source for vehicle gauze, signal lights, display lights, display devices, light source for sheet radiator, displays, decorations, various lights, and switching elements.

In the optical semiconductor device of the present invention, a cured product of the sealant for an optical semiconductor device of the present invention seals the light-emitting element formed of an optical semiconductor. In the optical semiconductor device of the present invention, a cured product of the sealant for an optical semiconductor device is disposed in a manner to seal the light-emitting element formed of an optical semiconductor such as LED. Therefore, the cured product of the sealant for an optical semiconductor device sealing the light-emitting element is less likely to crack, is less likely to peel from the package, and furthermore, can enhance the light transmissivity, heat resistance, weather resistance and gas barrier property.

(Embodiments of Optical Semiconductor Devices)

FIG. 1 shows a front cross-sectional view of an optical semiconductor device according to a first embodiment of the present invention.

An optical semiconductor device 1 of the present embodiment includes a housing 2. An optical semiconductor element 3 formed of an LED is provided in the housing 2. The optical semiconductor element 3 is surrounded by an inner face 2a having the light-reflective property of the housing 2. According to the present embodiment, the optical semiconductor element 3 is used as a light-emitting element formed of an optical semiconductor.

The inner face 2a is formed such that the diameter of the inner face 2a increases towards an opening end. For this reason, a portion of light emitted from the optical semiconductor device 3 and arriving at the inner face 2a is reflected on the inner face 2a and travels to a front side of the optical semiconductor element 3. A region surrounded by the inner face 2a is filled with a sealant for an optical semiconductor device 4 in a manner to seal the optical semiconductor device 3.

The structure shown in FIG. 1 is mere an example of the optical semiconductor device according to the present invention. The implementation structure and the like of the optical semiconductor device may be appropriately modified.

Hereinafter, the present invention will be described in more detail with reference to examples. The present invention is not limited to the examples.

Synthesis Example 1

Synthesis of First Organopolysiloxane

Trimethylmethoxysilane (63 g), dimethyldimethoxysilane (90 g), diphenyldimethoxysilane (183 g), and vinyltrimethoxy silane (133 g) were charged into a 1000 mL separable flask equipped with a thermometer, a dropping appliance, and a stirrer, and were stirred at 50° C. An aqueous solution of 0.8 g potassium hydroxide dissolved in 114 g of water was slowly dropwise added to the mixture, and then stirred for six hours at 50° C. for reaction to give a reaction solution. Subsequently, 0.9 g of acetic acid was added to the reaction solution, and volatile components were evaporated in vacuo. Thereafter, potassium acetate was removed by filtration, and thereby a polymer (A) was provided.

The number average molecular weight (Mn) of the polymer (A) was 1700. Result of chemical structure identification using $^{29}$Si—NMR showed that the polymer (A) had a following average composition formula (A1). Composition formula (A1)

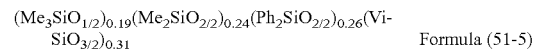
$(Me_3SiO_{1/2})_{0.19}(Me_2SiO_{2/2})_{0.24}(Ph_2SiO_{2/2})_{0.26}(ViSiO_{3/2})_{0.31}$  Formula (51-5)

In the formula (A1), Me refers to a methyl group, Ph refers to a phenyl group, and Vi refers to a vinyl group.

A phenyl group content in the polymer (A) was 37 mol %.

The molecular weights of polymers obtained in respective synthesis example 1 and 2 to 11 were determined by adding 1 mL of tetrahydrofuran to 10 mg of each polymer, stirring the mixture until dissolved, followed by analysis by gel permeation chromatography (GPC). In the GPC analysis, a measuring apparatus produced by Waters (column: two columns, Shodex GPC LF-804 (length: 300 mm) produced by Showa Denko K.K, temperature: at 40° C., flow rate: 1 mL/min, solvent: tetrahydrofuran, Standard material: polystyrene) was used.

Synthesis Example 2

Synthesis of First Organopolysiloxane

Dimethyldimethoxysilane (126 g), diphenyldimethoxysilane (318 g), and vinylmethyldimethoxysilane (119 g) were charged into a 1000 mL separable flask equipped with a thermometer, a dropping appliance, and a stirrer, and were stirred at 50° C. An aqueous solution of 0.8 g potassium hydroxide dissolved in 108 g of water was slowly dropwise added to the mixture, and then stirred for six hours at 50° C. for reaction to give a reaction solution. Subsequently, 0.9 g of acetic acid was added to the reaction solution, and volatile components were evaporated in vacuo. Thereafter, potassium acetate was removed by filtration, and thereby a polymer (B) was provided.

The number average molecular weight (Mn) of the polymer (B) was 5300. Result of chemical structure identification using $^{29}$Si—NMR showed that the polymer (B) had a following average composition formula (B1).

$(Me_2SiO_{2/2})_{0.25}(Ph_2SiO_{2/2})_{0.95}$
$(ViMeSiO_{2/2})_{0.30}$  Composition formula (B1)

In the formula (B1), Me refers to a methyl group, Ph refers to a phenyl group, and Vi refers to a vinyl group.

A phenyl group content in the polymer (B) was 52 mol %.

Synthesis Example 3

Synthesis of First Organopolysiloxane

Dimethyldimethoxysilane (60 g), diphenyldimethoxysilane (317 g), vinylmethyldimethoxysilane (119 g), and 1,6-bis(dimethylmethoxysilyl)hexane (79 g) were charged into a 1000 mL separable flask equipped with a thermometer, a dropping appliance, and a stirrer, and were stirred at 50° C. An aqueous solution of 0.8 g potassium hydroxide dissolved in 108 g of water was slowly dropwise added to the mixture, and then stirred for six hours at 50° C. for reaction to give a reaction solution. Subsequently, 0.9 g of acetic acid was added to the reaction solution, and volatile components were evaporated in vacuo. Thereafter, potassium acetate was removed by filtration, and thereby a polymer (C) was provided.

The number average molecular weight (Mn) of the polymer (C) was 3600. Result of chemical structure identification using $^{29}$Si—NMR showed that the polymer (C) had a following average composition formula (C1)

$(Me_2SiO_{2/2})_{0.16}(Ph_2SiO_{2/2})_{0.44}$
$(ViMeSiO_{2/2})_{0.30}$
$(Me_4SiHexO_{2/2})_{0.10}$  Composition formula (C1)

In the formula (C1), Me refers to a methyl group, Ph refers to a phenyl group, Vi refers to a vinyl group, and Hex refers to a hexylene group.

A phenyl group content in the polymer (C) was 46 mol %.

Synthesis Example 4

Synthesis of First Organopolysiloxane

Dimethyldimethoxysilane (60 g), diphenyldimethoxysilane (317 g), vinylmethyldimethoxysilane (119) g, and 1,4-bis(dimethylmethoxysilyl)benzene (76 g) were charged into a 1000 mL separable flask equipped with a thermometer, a dropping appliance, and a stirrer, and were stirred at 50° C. An aqueous solution of 0.8 g potassium hydroxide dissolved in 108 g of water was slowly dropwise added to the mixture, and then stirred for six hours at 50° C. for reaction to give a reaction solution. Subsequently, 0.9 g of acetic acid was added to the reaction solution, and volatile components were evaporated in vacuo. Thereafter, potassium acetate was removed by filtration, and thereby a polymer (D) was provided.

The number average molecular weight (Mn) of the polymer (D) was 3400. Result of chemical structure identification using $^{29}$Si—NMR showed that the polymer (D) had a following average composition formula (D1).

$(Me_2SiO_{2/2})_{0.16}(Ph_2SiO_{2/2})_{0.44}$
$(ViMeSiO_{2/2})_{0.30}$
$(Me_4SiPheO_{2/2})_{0.10}$  Composition formula (D1)

In the formula (D1), Me refers to a methyl group, Ph refers to a phenyl group, Vi refers to a vinyl group, and Phe refers to a phenylene group.

A content of the phenyl group and the phenylene group (aryl group content) in the polymer (D) was 52 mol %.

Synthesis Example 5

Synthesis of Second Organopolysiloxane

Trimethylmethoxysilane (31 g), 1,1,3,3-tetramethyldisiloxane (50 g), dimethyldimethoxysilane (108 g), and phenyltrimethoxy silane (208 g) were charged into a 1000 mL separable flask equipped with a thermometer, a dropping appliance, and a stirrer, and were stirred at 50° C. An aqueous solution of 1.4 g hydrochloric acid in 101 g of water was slowly dropwise added to the mixture, and then stirred for six hours at 50° C. for reaction to give a reaction solution. Subsequently, volatile components were evaporated in vacuo, and thereby a polymer was provided. To the polymer were added 150 g of hexane and 150 g of ethylacetate. The resulting mixture was washed 10 times with 300 g of ion-exchange water, and then volatile components were evaporated in vacuo. Thereby, a polymer (E) was provided.

The number average molecular weight (Mn) of the polymer (E) was 1000. Result of chemical structure identification using $^{29}$Si—NMR showed that the polymer (E) had a following average composition formula (E1).

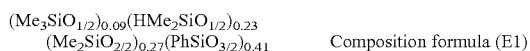
$(Me_3SiO_{1/2})_{0.09}(HMe_2SiO_{1/2})_{0.23}$
$(Me_2SiO_{2/2})_{0.27}(PhSiO_{3/2})_{0.41}$  Composition formula (E1)

In the formula (E1), Me refers to a methyl group, and Ph refers to a phenyl group.

A phenyl group content in the polymer (E) was 33 mol %.

Synthesis Example 6

Synthesis of Second Organopolysiloxane

Trimethylmethoxysilane (16 g), 1,1,3,3-tetramethyldisiloxane (50 g), dimethyldimethoxysilane (36 g), diphenyldimethoxysilane (183 g), phenyltrimethoxysilane (149 g), and vinyltrimethoxysilane (45 g) were charged into a 1000 mL separable flask equipped with a thermometer, a dropping appliance, and a stirrer, and were stirred at 50° C. An aqueous solution of 1.4 g hydrochloric acid in 104 g of water was slowly dropwise added to the mixture, and then stirred for six hours at 50° C. for reaction to give a reaction solution. Subsequently, volatile components were evaporated in vacuo, and thereby a polymer was provided. To the polymer were added 150 g of hexane and 150 g of ethylacetate. The resulting mixture was washed 10 times with 300 g of ion-exchange water, and then volatile components were evaporated in vacuo.

Thereby, a polymer (F) was provided.

The number average molecular weight (Mn) of the polymer (F) was 1000. Result of chemical structure identification using $^{29}$Si—NMR showed that the polymer (F) had a following average composition formula (F1).

$(Me_3SiO_{1/2})_{0.05}(HMe_2SiO_{1/2})_{0.23}$
$(Me_2SiO_{2/2})_{0.09}(Ph_2SiO_{2/2})_{0.26}$
$(PhSiO_{3/2})_{0.27}(ViSiO_{3/2})_{0.10}$     Composition formula (F1)

In the formula (F1), Me refers to a methyl group, Ph refers to a phenyl group, and Vi refers to a vinyl group.

A phenyl group content in the polymer (F) was 51 mol %.

Synthesis Example 7

Synthesis of Second Organopolysiloxane

Trimethylmethoxysilane (31 g), 1,1,3,3-tetramethyldisiloxane (40 g), diphenyldimethoxysilane (110 g), phenyltrimethoxysilane (268 g), and vinyltrimethoxysilane (45 g) were charged into a 1000 mL separable flask equipped with a thermometer, a dropping appliance, and a stirrer, and were stirred at 50° C. An aqueous solution of 1.4 g hydrochloric acid in 116 g of water was slowly dropwise added to the mixture, and then stirred for six hours at 50° C. for reaction to give a reaction solution. Subsequently, volatile components were evaporated in vacuo, and thereby a polymer was provided. To the polymer were added 150 g of hexane and 150 g of ethylacetate. The resulting mixture was washed 10 times with 300 g of ion-exchange water, and then volatile components were evaporated in vacuo. Thereby, a polymer (G) was provided.

The number average molecular weight (Mn) of the polymer (G) was 1100. Result of chemical structure identification using $^{29}$Si—NMR showed that the polymer (G) had a following average composition formula (G1)

$(Me_3SiO_{1/2})_{0.09}(HMe_2SiO_{1/2})_{0.19}$
$(Ph_2SiO_{2/2})_{0.16}(PhSiO_{3/2})_{0.46}$
$(Vi SiO_{3/2})_{0.10}$     Composition formula (G1)

In the formula (G1), Me refers to a methyl group, Ph refers to a phenyl group, and Vi refers to a vinyl group.

A phenyl group content in the polymer (G) was 51 mol %.

Synthesis Example 8

Synthesis of Second Organopolysiloxane

Trimethylmethoxysilane (31 g), 1,1,3,3-tetramethyldisiloxane (40 g), diphenyldimethoxysilane (183 g), phenyltrimethoxysilane (149 g), vinyltrimethoxysilane (45 g) and 1,4-bis(dimethylmethoxysilyl)benzene (76 g) were charged into a 1000 mL separable flask equipped with a thermometer, a dropping appliance, and a stirrer, and were stirred at 50° C. An aqueous solution of 1.4 g hydrochloric acid in 105 g of water was slowly dropwise added to the mixture, and then stirred for six hours at 50° C. for reaction to give a reaction solution. Subsequently, volatile components were evaporated in vacuo, and thereby a polymer was provided. To the polymer were added 150 g of hexane and 150 g of ethylacetate. The resulting mixture was washed 10 times with 300 g of ion-exchange water, and then volatile components were evaporated in vacuo. Thereby, a polymer (H) was provided.

The number average molecular weight (Mn) of the polymer (H) was 1100. Result of chemical structure identification using $^{29}$Si—NMR showed that the polymer (H) had a following average composition formula (H1).

$(Me_3SiO_{1/2})_{0.09}(HMe_2SiO_{1/2})_{0.19}$
$(Ph_2SiO_{2/2})_{0.26}(PhSiO_{3/2})_{0.26}$
$(Vi SiO_{3/2})_{0.10}(Me_4SiPheO_{2/2})_{0.10}$     Composition formula (H1)

In the formula (H1), Me refers to a methyl group, Ph refers to a phenyl group, Vi refers to a vinyl group, and Phe refers to a phenylene group.

A content of the phenyl group and the phenylene group (aryl group content) in the polymer (H) was 51 mol %.

Synthesis Example 9

Synthesis of First Organopolysiloxane

Trimethylmethoxysilane (94 g), dimethyldimethoxysilane (99 g), diphenyldimethoxysilane (92 g), and vinyltrimethoxysilane (133 g) were charged into a 1000 mL separable flask equipped with a thermometer, a dropping appliance, and a stirrer, and were stirred at 50° C. An aqueous solution of 0.8 g potassium hydroxide dissolved in 108 g of water was slowly dropwise added to the mixture, and then stirred for six hours at 50° C. for reaction to give a reaction solution. Subsequently, 0.9 g of acetic acid was added to the reaction solution, and volatile components were evaporated in vacuo. Thereafter, potassium acetate was removed by filtration, and thereby a polymer (I) was provided.

The number average molecular weight (Mn) of the polymer (I) was 1800. Result of chemical structure identification using $^{29}$Si—NMR showed that the polymer (I) had a following average composition formula (I1).

$(Me_3SiO_{1/2})_{0.29}(Me_2SiO_{2/2})_{0.27}$
$(Ph_2SiO_{2/2})_{0.13}(ViSiO_{3/2})_{0.31}$     Composition formula (I1)

In the formula (I1), Me refers to a methyl group, Ph refers to a phenyl group, and Vi refers to a vinyl group.

A phenyl group content in the polymer (I) was 21 mol %.

Synthesis Example 10

Synthesis of First Organopolysiloxane

Dimethyldimethoxysilane (180 g), diphenyldimethoxysilane (73 g), vinylmethyldimethoxysilane (119 g), and 1,4-bis(dimethylmethoxysilyl)benzene (76 g) were charged into a 1000 mL separable flask equipped with a thermometer, a dropping appliance, and a stirrer, and were stirred at 50° C. An aqueous solution of 0.8 g potassium hydroxide dissolved in 108 g of water was slowly dropwise added to the mixture, and then stirred for six hours at 50° C. for reaction to give a reaction solution. Subsequently, 0.9 g of acetic acid was added to the reaction solution, and volatile components were evaporated in vacuo. Thereafter, potassium acetate was removed by filtration, and thereby a polymer (J) was provided.

The number average molecular weight (Mn) of the polymer (J) was 3400. Result of chemical structure identification using $^{29}$Si—NMR showed that the polymer (J) had a following average composition formula (J1).

$(Me_2SiO_{2/2})_{0.49}(Ph_2SiO_{2/2})_{0.10}$
$(ViMeSiO_{2/2})_{0.31}(Me_4$
$SiPheO_{2/2})_{0.10}$     Composition formula (J1)

In the formula (J1), Me refers to a methyl group, Ph refers to a phenyl group, Vi refers to a vinyl group, and Phe refers to a phenylene group.

A content of the phenyl group and the phenylene group (aryl group content) in the polymer (J) was 22 mol %.

Synthesis Example 11

Synthesis of Second Organopolysiloxane

Trimethylmethoxysilane (31 g), 1,1,3,3-hexamethyldisiloxane (50 g), dimethyldimethoxysilane (140 g), diphenyldimethoxysilane (59 g), phenyltrimethoxy silane (48 g), and vinyltrimethoxysilane (45 g) were charged into a 1000 mL separable flask equipped with a thermometer, a dropping appliance, and a stirrer, and were stirred at 50° C. An aqueous solution of 1.4 g hydrochloric acid in 92 g of water was slowly dropwise added to the mixture, and then stirred for six hours at 50° C. for reaction to give a reaction solution. Subsequently, volatile components were evaporated in vacuo, and thereby a polymer was provided. To the polymer were added 150 g of hexane and 150 g of ethylacetate. The resulting mixture was washed 10 times with 300 g of ion-exchange water, and then volatile components were evaporated in vacuo. Thereby, a polymer (K) was provided.

The number average molecular weight (Mn) of the polymer (K) was 600. Result of chemical structure identification using $^{29}$Si—NMR showed that the polymer (K) had a following average composition formula (K1)

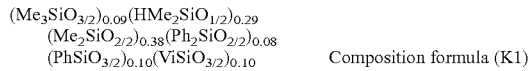    Composition formula (K1)

In the formula (K1), Me refers to a methyl group, Ph refers to a phenyl group, and Vi refers to a vinyl group.

A phenyl group content in the polymer (K) was 23 mol %.

Synthesis of Platinum-Alkenyl Complex A

Chloroplatinic acid hexahydrate ($H_2PtCl6.H_2O$, 300 mg) and 2-propanol (4.6 ml) were charged into a reaction flask equipped with a circulation pipe, and then stirred for 20 minutes at room temperature under nitrogen atmosphere. Upon passage of the 20 minutes, sodium hydrogen carbonate ($NaHCO_3$, 400 mg) was added to a resulting mixture, followed by stirring until gas generation stopped. Next, 1,3-divinyl-1,1,3,3-tetramethyldisiloxane (8 equivalent, 864 mg) was further added, and the reaction solution was stirred for 24 hours at 60° C. When the temperature of the reaction solution reached room temperature, anhydrous magnesium sulfate (300 mg) was added to the reaction solution and stirred for five minutes. Thereafter, the resulting solution was filtered through Celite using diethyl ether as a solvent, and the filtrate was evaporated until the amount of the solution reached 5 g. Thereby, a solution of a platinum-alkenyl complex A was provided.

Synthesis of Platinum-Alkenyl Complex B

Chloroplatinic acid hexahydrate ($H_2PtCl6.H_2O$, 300 mg) and 2-propanol (4.6 ml) were charged into a reaction flask equipped with a circulation pipe, and then stirred for 20 minutes at room temperature under nitrogen atmosphere. Upon passage of the 20 minutes, sodium hydrogen carbonate ($NaHCO_3$, 400 mg) was added to a resulting mixture, followed by stirring until gas generation stopped. Next, 1,3-divinyl-1,1,3,3-tetramethyldisiloxane (20 equivalent, 2.16 g) was further added, and the reaction solution was stirred for 24 hours at 60° C. When the temperature of the reaction solution reached room temperature, anhydrous magnesium sulfate (300 mg) was added to the reaction solution and stirred for five minutes. Thereafter, the resulting solution was filtered through Celite using diethyl ether as a solvent, and the filtrate was evaporated until the amount of the solution reached 5 g. Thereby, a solution of a platinum-alkenyl complex B was provided.

Synthesis of Platinum-Alkenyl Complex C

Chloroplatinic acid hexahydrate ($H_2PtCl6.H_2O$, 300 mg) and 2-propanol (4.6 ml) were charged into a reaction flask equipped with a circulation pipe, and then stirred for 20 minutes at room temperature under nitrogen atmosphere. Upon passage of the 20 minutes, sodium hydrogen carbonate ($NaHCO_3$, 400 mg) was added to a resulting mixture, followed by stirring until gas generation stopped. Next, 2, 4,6, 8-tetramethyl-2,4,6,8-tetravinylcyclotetrasiloxane (20 equivalent, 3.99 g) was further added, and the reaction solution was stirred for 24 hours at 60° C. When the temperature of the reaction solution reached room temperature, anhydrous magnesium sulfate (300 mg) was added to the reaction solution and stirred for five minutes. Thereafter, the resulting solution was filtered through Celite using diethyl ether as a solvent, and the filtrate was evaporated until the amount of the solution reached 5 g. Thereby, a solution of a platinum-alkenyl complex C was provided.

Synthesis of Platinum-Alkenyl Complex D

Chloroplatinic acid hexahydrate ($H_2PtCl6.H_2O$, 300 mg) and 2-propanol (4.6 ml) were charged into a reaction flask with a circulation pipe, and then stirred for 20 minutes at room temperature under nitrogen atmosphere. Upon passage of the 20 minutes, sodium hydrogen carbonate ($NaHCO_3$, 400 mg) was added to a resulting mixture, followed by stirring until gas generation stopped. Next, 1,3-divinyl-1,1,3,3-tetramethyldisiloxane (5 equivalent, 540 mg) was further added, and the reaction solution was stirred for 24 hours at 60° C. When the temperature of the reaction solution reached room temperature, anhydrous magnesium sulfate (300 mg) was added to the reaction solution and stirred for five minutes. Thereafter, the resulting solution was filtered through Celite using diethyl ether as a solvent, and the filtrate was evaporated until the amount of the solution reached 5 g. Thereby, a solution of a platinum-alkenyl complex D was provided.

Example 1

The polymer A (10 g), the polymer E (10 g), and a solution of the platinum-alkenyl complex A (in an amount such that the platinum element content in a sealant was 10 ppm) were mixed and then defoamed so that a sealant for an optical semiconductor device was provided.

Example 2

The polymer A (10 g), the polymer E (10 g), and a solution of the platinum-alkenyl complex B (in an amount such that the platinum element content in a sealant was 10 ppm) were mixed and then defoamed so that a sealant for an optical semiconductor device was provided.

Example 3

The polymer A (10 g), the polymer E (10 g), and a solution of the platinum-alkenyl complex C (in an amount such that the platinum element content in a sealant was 10 ppm) were mixed and then defoamed so that a sealant for an optical semiconductor device was provided.

Example 4

The polymer B (10 g), the polymer E (10 g), and a solution of the platinum-alkenyl complex B (in an amount such that the platinum element content in a sealant was 10 ppm) were mixed and then defoamed so that a sealant for an optical semiconductor device was provided.

Example 5

The polymer C (10 g), the polymer E (10 g), and a solution of the platinum-alkenyl complex B (in an amount such that the platinum element content in a sealant was 10 ppm) were mixed and then defoamed so that a sealant for an optical semiconductor device was provided.

Example 6

The polymer C (10 g), the polymer E (10 g), a solution of the platinum-alkenyl complex B (in an amount such that the platinum element content in a sealant was 10 ppm), and silicon oxide particles (AEROSIL RY200, silicon oxide particles surface-treated with an organic silicon compound containing a polydimethyl siloxane group, surface area: 120 $m^2/g$, produced by Nippon Aerosil Co., Ltd.) (0.4 g) were mixed and then defoamed so that a sealant for an optical semiconductor device was provided.

Example 7

The polymer C (10 g), the polymer E (10 g), a solution of the platinum-alkenyl complex B (in an amount such that the platinum element content in a sealant was 10 ppm), and silicon oxide particles (AEROSIL R8500, silicon oxide particles surface-treated with an organic silicon compound containing a trimethylsilyl group, surface area: 140 $m^2/g$, produced by Nippon Aerosil Co., Ltd.) (2 g) were mixed and then defoamed so that a sealant for an optical semiconductor device was provided.

Example 8

The polymer C (10 g), the polymer F (10 g), a solution of the platinum-alkenyl complex B (in an amount such that the platinum element content in a sealant was 10 ppm), and silicon oxide particles (AEROSIL RY200, silicon oxide particles surface-treated with an organic silicon compound containing a polydimethyl siloxane group, surface area: 120 $m^2/g$, produced by Nippon Aerosil Co., Ltd.) (0.4 g) were mixed and then defoamed so that a sealant for an optical semiconductor device was provided.

Example 9

The polymer C (10 g), the polymer G (10 g), a solution of the platinum-alkenyl complex B (in an amount such that the platinum element content in a sealant was 10 ppm), and silicon oxide particles (AEROSIL RY200, silicon oxide particles surface-treated with an organic silicon compound containing a polydimethyl siloxane group, surface area: 120 $m^2/g$, produced by Nippon Aerosil Co., Ltd.) (0.4 g) were mixed and then defoamed so that a sealant for an optical semiconductor device was provided.

Example 10

The polymer C (10 g), the polymer H (10 g), a solution of the platinum-alkenyl complex B (in an amount such that the platinum element content in a sealant was 10 ppm), and silicon oxide particles (AEROSIL RY200, silicon oxide particles surface-treated with an organic silicon compound containing a polydimethyl siloxane group, surface area: 120 $m^2/g$, produced by Nippon Aerosil Co., Ltd.) (0.4 g) were mixed and then defoamed so that a sealant for an optical semiconductor device was provided.

Example 11

The polymer D (10 g), the polymer E (10 g), a solution of the platinum-alkenyl complex B (in an amount such that the platinum element content in a sealant was 10 ppm), and silicon oxide particles (AEROSIL RY200, silicon oxide particles surface-treated with an organic silicon compound containing a polydimethyl siloxane group, surface area: 120 $m^2/g$, produced by Nippon Aerosil Co., Ltd.) (0.4 g) were mixed and then defoamed so that a sealant for an optical semiconductor device was provided.

Example 12

The polymer D (10 g), the polymer F (10 g), a solution of the platinum-alkenyl complex B (in an amount such that the platinum element content in a sealant was 10 ppm), and silicon oxide particles (AEROSIL RY200, silicon oxide particles surface-treated with an organic silicon compound containing a polydimethyl siloxane group, surface area: 120 $m^2/g$, produced by Nippon Aerosil Co., Ltd.) (0.4 g) were mixed and then defoamed so that a sealant for an optical semiconductor device was provided.

Example 13

The polymer D (10 g), the polymer G (10 g), a solution of the platinum-alkenyl complex B (in an amount such that the platinum element content in a sealant was 10 ppm), and silicon oxide particles (AEROSIL RY200, silicon oxide particles surface-treated with an organic silicon compound containing a polydimethyl siloxane group, surface area: 120 $m^2/g$, produced by Nippon Aerosil Co, Ltd.) (0.4 g) were mixed and then defoamed so that a sealant for an optical semiconductor device was provided.

Example 14

The polymer D (10 g), the polymer H (10 g), a solution of the platinum-alkenyl complex B (in an amount such that the platinum element content in a sealant was 10 ppm), and silicon oxide particles (AEROSIL RY200, silicon oxide particles surface-treated with an organic silicon compound containing a polydimethyl siloxane group, surface area: 120 $m^2/g$, produced by Nippon Aerosil Co., Ltd.) (0.4 g) were mixed and then defoamed so that a sealant for an optical semiconductor device was provided.

Example 15

The polymer I (10 g), the polymer E (10 g), and a solution of the platinum-alkenyl complex B (in an amount such that the platinum element content in a sealant was 10 ppm) were mixed and then defoamed so that a sealant for an optical semiconductor device was provided.

Example 16

The polymer J (10 g), the polymer E (10 g), and a solution of the platinum-alkenyl complex B (in an amount such that the platinum element content in a sealant was 10 ppm) were mixed and then defoamed so that a sealant for an optical semiconductor device was provided.

Example 17

The polymer A (10 g), the polymer K (10 g), and a solution of the platinum-alkenyl complex B (in an amount such that the platinum element content in a sealant was 10 ppm) were mixed and then defoamed so that a sealant for an optical semiconductor device was provided.

Comparative Example 1

The polymer A (10 g), the polymer E (10 g), and a solution of the platinum-alkenyl complex D (in an amount such that the platinum element content in a sealant was 10 ppm) were mixed and then defoamed so that a sealant for an optical semiconductor device was provided.

Comparative Example 2

The polymer A (8 g), the polymer E (12 g), and a solution of the platinum-alkenyl complex A (in an amount such that the platinum element content in a sealant was 10 ppm) were mixed and then defoamed so that a sealant for an optical semiconductor device was provided.

Comparative Example 3

The polymer A (8 g), the polymer E (12 g), and a solution of the platinum-alkenyl complex B (in an amount such that the platinum element content in a sealant was 10 ppm) were mixed and then defoamed so that a sealant for an optical semiconductor device was provided.

Comparative Example 4

The polymer A (8 g), the polymer E (12 g), and a solution of the platinum-alkenyl complex C (in an amount such that the platinum element content in a sealant was 10 ppm) were mixed and then defoamed so that a sealant for an optical semiconductor device was provided.

(Evaluation)

(Production of Optical Semiconductor Device)

An optical semiconductor device was produced as follows: An element was prepared in which a light-emitting element having a main emission peak of 460 nm was mounted through die bond on a polyphthalamide housing material having a silver-plated lead electrode, with the lead electrode connected to the light-emitting element by a gold wire. Next, the sealant for an optical semiconductor device was charged into the element, and then heated at 150° C. for two hours to cure the sealant. The resultant optical semiconductor device was examined by a power-on test, a gas corrosion test and a heat shock test mentioned below.

(Power-on Test)

Luminance upon passing a 20 mA current through a light-emitting element in the optical semiconductor device at a temperature of 23° C. (hereinafter also referred to as "initial luminance") was measured using a light measuring device (trade name: OL770, produced by Optronic Laboratories).

Next, the optical semiconductor device, in which a 20 mA current was still passed through the light-emitting element, was placed in a chamber under a relative humidity atmosphere of 85% at a temperature of 85° C., and was allowed to stand for 500 hours. After passage of the 500 hours, the luminance upon passing a 20 mA current through the light-emitting element at a temperature of 23° C. was measured using a light measuring device (trade name: OL770, produced by Optronic Laboratories). The reduction rate of the measured luminance to the initial luminance was calculated. The results were evaluated as follows: "○○" in the case where the luminance reduction rate was less than 5%; "○" in the case where the reduction rate exceeded 5% and less than 10%; "Δ" in the case where the reduction rate exceeded 10% and less than 20%; and "x" in the case where the reduction rate was not less than 20%.

(Color Change)

Color change of samples before and after the power-on test was examined by eye observation.

The results were evaluated as follows: "○" in the case where no color change was observed; "Δ" in the case where slight color change was observed; and "x" in the case where significant color change was observed, between the samples before and after the power-on test.

(Gas Corrosion Test)

The optical semiconductor device was placed in a chamber under a relative humidity atmosphere of 90% at a temperature of 40° C. Then, the chamber was filled with gases such that hydrogen sulfide gas concentration and sulfur dioxide gas concentration reached 5 ppm and 15 ppm, respectively. Eye observation of the silver-plated lead electrode was performed 24 hours, 48 hours, 96 hours, 168 hours, and 500 hours after the gas filling.

The results were evaluated as follows: "○○" in the case where no tarnish was observed in the silver plating; "○" in the case where a few parts of the silver plating were tarnished brownish-red; "Δ" in the case where almost all the silver plating was tarnished brown; and "x" in the case where almost all the silver plating was tarnished black.

(Heat Shock Test)

Using a liquid-to-liquid thermal shock chamber (trade name "TSB-51", produced by ESPEC CORP), a thermal cycle test in which a single cycle consisted of keeping at −50° C. for five minutes, heating to 135° C., keeping at 135° C. for five minutes, and cooling to −50° C. was performed on the optical semiconductor device. 20 pieces of each sample were taken out after 500 cycles, 1000 cycles, and 1500 cycles.

The samples were observed using a stereoscopic microscope (trade name "SMZ-10", produced by Nikon Corporation) to check occurrence of cracks in the 20 pieces of the samples, to check peeling of the sealant for an optical semiconductor device from the package or the electrode, and to count the number of samples (number of NG) in which cracking or peeling occurred.

Table 1 and Table 2 below show the results. In the Table 1 and Table 2, "ratio" refers to a ratio (the number of the alkenyl group bound to a silicon atom/the number of the hydrogen atom bound to a silicon atom) of the number of the alkenyl group bound to a silicon atom in the organopolysiloxane to the number of the hydrogen atom bound to a silicon atom in the organopolysiloxane in the sealant.

TABLE 1

| | | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|---|
| | Ratio | 1.35 | 1.35 | 1.35 | 1.30 | 1.30 | 1.30 | 1.30 | 1.74 | 2.11 | 2.11 | 1.30 |
| | Power-on Test | ⊙⊙ | ⊙⊙ | ⊙⊙ | ⊙⊙ | ⊙⊙ | ⊙⊙ | ⊙⊙ | ⊙⊙ | ⊙⊙ | ⊙⊙ | ⊙⊙ |
| | Color change | ○ | ○ | ○ | ○ | ○ | ○ | ○ | ○ | ○ | ○ | ○ |
| Gas corrosion test | 24 hours later | ⊙⊙ | ⊙⊙ | ⊙⊙ | ⊙⊙ | ⊙⊙ | ⊙⊙ | ⊙⊙ | ⊙⊙ | ⊙⊙ | ⊙⊙ | ⊙⊙ |
| | 48 hours later | ⊙⊙ | ⊙⊙ | ⊙⊙ | ⊙⊙ | ⊙⊙ | ⊙⊙ | ⊙⊙ | ⊙⊙ | ⊙⊙ | ⊙⊙ | ⊙⊙ |
| | 96 hours later | ○ | ○ | ○ | ⊙⊙ | ⊙⊙ | ⊙⊙ | ⊙⊙ | ⊙⊙ | ⊙⊙ | ⊙⊙ | ⊙⊙ |
| | 168 hours later | ○ | ○ | ○ | ○ | ○ | ⊙⊙ | ⊙⊙ | ⊙⊙ | ⊙⊙ | ⊙⊙ | ⊙⊙ |
| | 500 hours later | △ | △ | △ | △ | ○ | ○ | ○ | ○ | ○ | ⊙⊙ | ⊙⊙ |
| Heat shock test (Number of NG) | 500 cycles | 0/20 | 0/20 | 0/20 | 0/20 | 0/20 | 0/20 | 0/20 | 0/20 | 0/20 | 0/20 | 0/20 |
| | 1000 cycles | 0/20 | 0/20 | 0/20 | 0/20 | 0/20 | 0/20 | 0/20 | 0/20 | 0/20 | 0/20 | 0/20 |
| | 1500 cycles | 5/20 | 4/20 | 3/20 | 0/20 | 0/20 | 0/20 | 0/20 | 0/20 | 0/20 | 0/20 | 0/20 |

TABLE 2

| | | Example 12 | Example 13 | Example 14 | Example 15 | Example 16 | Example 17 | Comparative Example 1 | Comparative Example 2 | Comparative Example 3 | Comparative Example 4 |
|---|---|---|---|---|---|---|---|---|---|---|---|
| | Ratio | 1.74 | 2.11 | 2.11 | 1.35 | 1.35 | 1.71 | 1.35 | 0.90 | 0.90 | 0.90 |
| | Power-on Test | ⊙⊙ | ⊙⊙ | ⊙⊙ | ⊙⊙ | ⊙⊙ | ⊙⊙ | △ | × | × | × |
| | Color change | ○ | ○ | ○ | ○ | ○ | ○ | △ | × | × | × |
| Gas corrosion test | 24 hours later | ⊙⊙ | ⊙⊙ | ⊙⊙ | ○ | ○ | ○ | ⊙⊙ | ⊙⊙ | ⊙⊙ | ⊙⊙ |
| | 48 hours later | ⊙⊙ | ⊙⊙ | ⊙⊙ | △ | ○ | △ | ⊙⊙ | ⊙⊙ | ⊙⊙ | ⊙⊙ |
| | 96 hours later | ⊙⊙ | ⊙⊙ | ⊙⊙ | △ | △ | △ | ○ | ○ | ○ | ○ |
| | 168 hours later | ⊙⊙ | ⊙⊙ | ⊙⊙ | × | × | × | ○ | ○ | ○ | ○ |
| | 500 hours later | ⊙⊙ | ⊙⊙ | ⊙⊙ | × | × | × | △ | △ | △ | △ |
| Heat shock test (Number of NG) | 500 cycles | 0/20 | 0/20 | 0/20 | 0/20 | 0/20 | 0/20 | 0/20 | 0/20 | 0/20 | 0/20 |
| | 1000 cycles | 0/20 | 0/20 | 0/20 | 5/20 | 0/20 | 0/20 | 0/20 | 0/20 | 0/20 | 0/20 |
| | 1500 cycles | 0/20 | 0/20 | 0/20 | 10/20 | 0/20 | 4/20 | 6/20 | 7/20 | 7/20 | 8/20 |

EXPLANATION OF SYMBOLS

1 Optical semiconductor device
2 Housing
2a Inner face
3 Optical semiconductor element
4 Sealant for an optical semiconductor device

The invention claimed is:

1. A sealant for an optical semiconductor device for use in an optical semiconductor device, comprising
a first organopolysiloxane not containing a hydrogen atom bound to a silicon atom, but containing an alkenyl group bound to a silicon atom and an aryl group bound to a silicon atom,
a second organopolysiloxane containing a hydrogen atom bound to a silicon atom and an aryl group bound to a silicon atom, and
a platinum-alkenyl complex,
wherein the platinum-alkenyl complex is obtainable by reacting chloroplatinic acid hexahydrate with not less than 6 equivalent of a bi- or higher-functional alkenyl compound, and
the ratio of the number of the alkenyl group bound to a silicon atom in the organopolysiloxane to the number of the hydrogen atom bound to a silicon atom in the organopolysiloxane in the sealant is not less than 1.0 and not more than 2.5.

2. The sealant for an optical semiconductor device according to claim 1,
wherein the first organopolysiloxane is a first organopolysiloxane represented by formula (1A) or formula (1B) shown below,
the second organopolysiloxane is a second organopolysiloxane represented by formula (51A) or formula (51B) shown below,
an aryl group content in the first organopolysiloxane calculated based on formula (X1) shown below is from 30 mol % to 70 mol %, and
an aryl group content in the second organopolysiloxane calculated based on formula (X51) shown below is from 30 mol % to 70 mol %;

[Chem. 1]

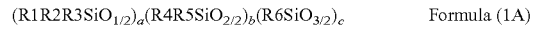

$(R1R2R3SiO_{1/2})_a(R4R5SiO_{2/2})_b(R6SiO_{3/2})_c$  Formula (1A)

In the formula (1A), a, b, and c satisfy the following equations: $a/(a+b+c)=0$ to $0.50$, $b/(a+b+c)=0.40$ to $1.0$, and $c/(a+b+c)=0$ to $0.50$; and
at least one of R1 to R6 represents a phenyl group, at least one of R1 to R6 represents an alkenyl group, and the rest of the R1 to R6 other than phenyl groups and alkenyl groups represent $C_1$ to $C_8$ hydrocarbon groups;

[Chem. 2]

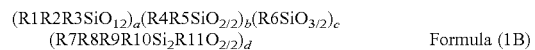

$(R1R2R3SiO_{1/2})_a(R4R5SiO_{2/2})_b(R6SiO_{3/2})_c$
$(R7R8R9R10Si_2R11O_{2/2})_d$  Formula (1B)

In the formula (1B), a, b, c and d satisfy the following equations: $a/(a+b+c+d)=0$ to $0.40$, $b/(a+b+c+d)=0.40$ to $0.99$, $c/(a+b+c+d)=0$ to $0.50$, and $d/(a+b+c+d)=0.01$ to $0.40$; and
at least one of R1 to R6 represents a phenyl group, at least one of R1 to R6 represents an alkenyl group, and the rest of the R1 to R6 other than phenyl groups and alkenyl groups represents $C_1$ to $C_8$ hydrocarbon groups, R7 to R10 each represent a $C_1$ to $C_8$ hydrocarbon group, and the unit $(R7R8R9R10Si_2R11O_{2/2})$ in the formula (1B) is a unit represented by formula (1b-1) shown below;

[Chem. 3]

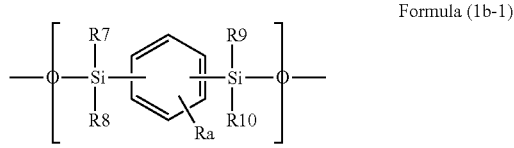

Formula (1b-1)

In the formula (1b-1), Ra represents a hydrogen atom or a $C_1$ to $C_8$ hydrocarbon group, and R7 to R10 each represent a $C_1$ to $C_8$ hydrocarbon group;

[Chem. 4]

$(R51R52R53SiO_{1/2})_p(R54R55SiO_{2/2})_q(R56SiO_{3/2})_r$   Formula (51A)

In the formula (51A), p, q, and r satisfy the following equations: p/(p+q+r)=0.05 to 0.50, q/(p+q+r)=0.05 to 0.50, and r/(p+q+r)=0.20 to 0.80; and at least one of R51 to R56 represents a phenyl group, at least one of R51 to R56 represents a hydrogen atom directly bound to a silicon atom, and the rest of the R51 to R56 other than phenyl groups and hydrogen atoms directly bound to a silicon atom represent $C_1$ to $C_8$ hydrocarbon groups;

[Chem. 5]

$(R51R52R53SiO_{1/2})_p(R54R55SiO_{2/2})_q(R56SiO_{3/2})_r$
$(R57R58R59R60Si_2R61O_{2/2})_s$   Formula (51B)

In the formula (51B), p, q, r and s satisfy the following equations: p/(p+q+r+s)=0.05 to 0.50, q/(p+q+r+s)=0.05 to 0.50, r/(p+q+r+s)=0.20 to 0.80, and s/(p+q+r+s)=0.01 to 0.40; and at least one of R51 to R56 represents a phenyl group, at least one of R51 to R56 represents a hydrogen atom directly bound to a silicon atom, and the rest of the R51 to R56 other than phenyl groups and hydrogen atoms directly bound to a silicon atom represent $C_1$ to $C_8$ hydrocarbon groups, R57 to R60 each represent a $C_1$ to $C_8$ hydrocarbon group, and the unit $(R57R58R59R60Si_2R60Si_2R61O_{2/2})$ in the formula (51B) is a unit represented by formula (51b-1) shown below;

[Chem. 6]

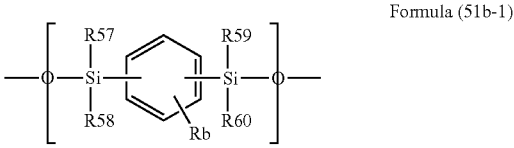

Formula (51b-1)

In the formula (51b-1), Rb represents a hydrogen atom or a $C_1$ to $C_8$ hydrocarbon group, and R57 to R60 each represent a $C_1$ to $C_8$ hydrocarbon group;

[Aryl group content(mol %)]=[(Average number of aryl group included in one molecule of the first organopolysiloxane whose average composition is represented by the formula (1A) or the formula (1B)×Molecular weight of the aryl group)/(Number average molecular weight of the first organopolysiloxane whose average composition is represented by the formula (1A) or the formula (1B))]×100   (Formula X1)

[Aryl group content(mol %)]=[(Average number of aryl group included in one molecule of the second organopolysiloxane whose average composition is represented by the formula (51A) or the formula (51B)×Molecular weight of the aryl group)/(Number average molecular weight of the second organopolysiloxane whose average composition is represented by the formula (51A) or the formula (51 B))]×100.   (Formula X51)

3. The sealant for an optical semiconductor device according to claim 2, comprising at least one of the first organopolysiloxane represented by the formula (1B) and the second organopolysiloxane represented by the formula (51B).

4. The sealant for an optical semiconductor device according to claim 1,
wherein the platinum content derived from the platinum-alkenyl complex in the sealant is not less than 1 ppm and not more than 300 ppm.

5. The sealant for an optical semiconductor device according to claim 1,
wherein the second organopolysiloxane contains a unit represented by formula (51-a) shown below;

[Chem. 7]

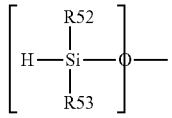

Formula (51-a)

In the formula (51-a), R52 and R53 each represent a hydrogen atom, a phenyl group, or a $C_1$ to $C_8$ hydrocarbon group.

6. The sealant for an optical semiconductor device according to claim 5,
wherein the proportion of the unit represented by the formula (51-a) in 100 mol % of the total siloxane unit of the second organopolysiloxane is not less than 5 mol %.

7. The sealant for an optical semiconductor device according to claim 1,
wherein the first organopolysiloxane contains a diphenyl siloxane unit including one silicon atom and two phenyl groups bound to the silicon atom,
the proportion of the diphenyl siloxane unit including one silicon atom and two phenyl groups bound to the silicon atom in 100 mol % of the total siloxane unit of the first organopolysiloxane is not less than 30 mol %.

8. The sealant for an optical semiconductor device according to claim 1,
wherein the second organopolysiloxane contains a diphenyl siloxane unit including one silicon atom and two phenyl groups bound to the silicon atom.

9. An optical semiconductor device, comprising
an optical semiconductor element, and
the sealant for an optical semiconductor device according to claim 1, which is provided to seal the optical semiconductor element.

10. The sealant for an optical semiconductor device according to claim 2,
wherein the platinum content derived from the platinum-alkenyl complex in the sealant is not less than 1 ppm and not more than 300 ppm.

11. The sealant for an optical semiconductor device according to claim 2,
wherein the second organopolysiloxane contains a unit represented by formula (51-a) shown below;

[Chem. 7]

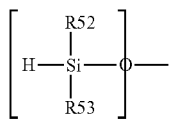

Formula (51-a)

In the formula (51-a), R52 and R53 each represent a hydrogen atom, a phenyl group, or a $C_1$ to $C_8$ hydrocarbon group.

12. The sealant for an optical semiconductor device according to claim 11,
wherein the proportion of the unit represented by the formula (51-a) in 100 mol % of the total siloxane unit of the second organopolysiloxane is not less than 5 mol %.

13. The sealant for an optical semiconductor device according to claim 2,
wherein the first organopolysiloxane contains a diphenyl siloxane unit including one silicon atom and two phenyl groups bound to the silicon atom,
the proportion of the diphenyl siloxane unit including one silicon atom and two phenyl groups bound to the silicon atom in 100 mol % of the total siloxane unit of the first organopolysiloxane is not less than 30 mol %.

14. The sealant for an optical semiconductor device according to claim 2,
wherein the second organopolysiloxane contains a diphenyl siloxane unit including one silicon atom and two phenyl groups bound to the silicon atom.

15. An optical semiconductor device, comprising
an optical semiconductor element, and
the sealant for an optical semiconductor device according to claim 2, which is provided to seal the optical semiconductor element.

16. An optical semiconductor device, comprising
an optical semiconductor element, and
the sealant for an optical semiconductor device according to claim 7, which is provided to seal the optical semiconductor element.

* * * * *